United States Patent
Kim et al.

(10) Patent No.: US 11,418,155 B2
(45) Date of Patent: *Aug. 16, 2022

(54) DIGITAL HYBRID MODE POWER AMPLIFIER SYSTEM

(71) Applicant: Dali Systems Co. Ltd., Grand Cayman (KY)

(72) Inventors: Wan Jong Kim, Coquitlam, CA (US); Kyoung Joon Cho, Coquitlam, CA (US); Shawn Patrick Stapleton, Vancouver (CA); Jong Heon Kim, Seoul (KR); Dali Yang, Mountain View, CA (US)

(73) Assignee: DALI WIRELESS, INC., Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/592,615

(22) Filed: Oct. 3, 2019

(65) Prior Publication Data

US 2020/0136567 A1    Apr. 30, 2020

Related U.S. Application Data

(63) Continuation of application No. 15/684,580, filed on Aug. 23, 2017, now abandoned, which is a
(Continued)

(51) Int. Cl.
*H03F 1/32* (2006.01)
*H03F 3/24* (2006.01)
(Continued)

(52) U.S. Cl.
CPC ......... *H03F 1/3247* (2013.01); *H03F 1/3258* (2013.01); *H03F 3/19* (2013.01);
(Continued)

(58) Field of Classification Search
CPC ........ H03F 1/3247; H03F 1/3258; H03F 3/19; H03F 3/20; H03F 3/24; H03F 2200/129;
(Continued)

(56) References Cited

U.S. PATENT DOCUMENTS 4,638,248 A    1/1987  Schweicker
4,700,151 A    10/1987 Nagata
(Continued)

FOREIGN PATENT DOCUMENTS

CN    1288341 A    3/2001
CN    1297608 A    5/2001
(Continued)

OTHER PUBLICATIONS

Mekechuk, Kelly et al. "Linearizing Power Amplifiers Using Digital Predistortion, EDA tools and Test Hardware" High Frequency Electronics; Apr. 2004.
(Continued)

*Primary Examiner* — Ankur Jain
(74) *Attorney, Agent, or Firm* — Artegis Law Group, LLP

(57) ABSTRACT

A RF-digital hybrid mode power amplifier system for achieving high efficiency and high linearity in wideband communication systems is disclosed. The present invention is based on the method of adaptive digital predistortion to linearize a power amplifier in the RF domain. The power amplifier characteristics such as variation of linearity and asymmetric distortion of the amplifier output signal are monitored by the narrowband feedback path and controlled by the adaptation algorithm in a digital module. Therefore, the present invention could compensate the nonlinearities as well as memory effects of the power amplifier systems and also improve performances, in terms of power added efficiency, adjacent channel leakage ratio and peak-to-average power ratio. The present disclosure enables a power ampli-
(Continued)

fier system to be field reconfigurable and support multi-modulation schemes (modulation agnostic), multi-carriers and multi-channels. As a result, the digital hybrid mode power amplifier system is particularly suitable for wireless transmission systems, such as base-stations, repeaters, and indoor signal coverage systems, where baseband I-Q signal information is not readily available.

22 Claims, 10 Drawing Sheets

Related U.S. Application Data continuation of application No. 14/271,881, filed on May 7, 2014, now Pat. No. 9,768,739, which is a continuation of application No. 12/108,502, filed on Apr. 23, 2008, now Pat. No. 8,811,917, which is a continuation-in-part of application No. 12/021,241, filed on Jan. 28, 2008, now Pat. No. 8,380,143, which is a continuation-in-part of application No. 11/799,239, filed on Apr. 30, 2007, now Pat. No. 8,064,850, which is a continuation-in-part of application No. 11/262,079, filed on Oct. 27, 2005, now Pat. No. 8,326,238, which is a continuation of application No. 10/137,556, filed on May 1, 2002, now Pat. No. 6,985,704.

(60) Provisional application No. 61/041,164, filed on Mar. 31, 2008, provisional application No. 61/012,416, filed on Dec. 7, 2007, provisional application No. 60/969,127, filed on Aug. 30, 2007, provisional application No. 60/969,131, filed on Aug. 30, 2007, provisional application No. 60/925,577, filed on Apr. 23, 2007, provisional application No. 60/925,603, filed on Apr. 23, 2007.

(51) Int. Cl.
*H03F 3/19* (2006.01)
*H03F 3/20* (2006.01)
(52) U.S. Cl.
CPC .............. *H03F 3/20* (2013.01); *H03F 3/24* (2013.01); *H03F 2200/129* (2013.01); *H03F 2200/451* (2013.01); *H03F 2201/3224* (2013.01); *H03F 2201/3227* (2013.01); *H03F 2201/3233* (2013.01)
(58) Field of Classification Search
CPC ....... H03F 2200/451; H03F 2201/3227; H03F 2201/3224; H03F 2201/3233
See application file for complete search history.

(56) References Cited

U.S. PATENT DOCUMENTS

| | | |
|---|---|---|
| 4,755,795 A | 7/1988 | Page |
| 4,890,300 A | 12/1989 | Andrews |
| 4,929,906 A | 5/1990 | Voyce et al. |
| 4,999,831 A | 3/1991 | Grace |
| 5,049,832 A | 9/1991 | Cavers |
| 5,105,445 A | 4/1992 | Karam et al. |
| 5,107,520 A | 4/1992 | Karam et al. |
| 5,121,412 A | 6/1992 | Borth |
| 5,132,639 A | 7/1992 | Blauelt et al. |
| 5,396,190 A | 3/1995 | Murata |
| 5,404,378 A | 4/1995 | Kimura |
| 5,457,557 A | 10/1995 | Zarem et al. |
| 5,486,789 A | 1/1996 | Palandech et al. |
| 5,524,286 A | 6/1996 | Chiesa et al. |
| 5,579,341 A | 11/1996 | Smith et al. |
| 5,579,342 A | 11/1996 | Crozier |
| 5,589,797 A | 12/1996 | Gans et al. |
| 5,596,600 A | 1/1997 | Dimes et al. |
| 5,619,202 A | 4/1997 | Wilson et al. |
| 5,621,730 A | 4/1997 | Kelley |
| 5,627,879 A | 5/1997 | Russell et al. |
| 5,644,622 A | 7/1997 | Russell et al. |
| 5,655,220 A | 8/1997 | Weiland et al. |
| 5,675,287 A | 10/1997 | Baker et al. |
| 5,678,198 A | 10/1997 | Lemson |
| 5,699,383 A | 12/1997 | Ichiyoshi |
| 5,732,333 A | 3/1998 | Cox et al. |
| 5,740,520 A | 4/1998 | Cyze et al. |
| 5,748,683 A | 5/1998 | Smith et al. |
| 5,757,229 A | 5/1998 | Mitzlaff |
| 5,786,728 A | 7/1998 | Alinikula |
| 5,794,153 A | 8/1998 | Ariyavisitakul et al. |
| 5,810,888 A | 9/1998 | Fenn |
| 5,818,883 A | 10/1998 | Smith et al. |
| 5,831,479 A | 11/1998 | Leffel et al. |
| 5,852,651 A | 12/1998 | Fischer et al. |
| 5,870,668 A | 2/1999 | Takano et al. |
| 5,880,863 A | 3/1999 | Rideout et al. |
| 5,898,338 A | 4/1999 | Proctor et al. |
| 5,920,808 A | 7/1999 | Jones et al. |
| 5,923,712 A | 7/1999 | Leyendecker et al. |
| 5,936,464 A | 8/1999 | Grondahl |
| 5,937,011 A | 8/1999 | Carney et al. |
| 5,949,283 A | 9/1999 | Proctor et al. |
| 5,959,499 A | 9/1999 | Khan et al. |
| 5,959,500 A | 9/1999 | Garrido |
| 5,963,549 A | 10/1999 | Perkins et al. |
| 5,973,011 A | 10/1999 | Noack et al. |
| 6,005,506 A | 12/1999 | Bazarjani et al. |
| 6,005,884 A | 12/1999 | Cook et al. |
| 6,014,366 A | 1/2000 | Ichiyoshi |
| 6,054,896 A | 4/2000 | Wright et al. |
| 6,055,418 A | 4/2000 | Harris et al. |
| 6,072,364 A | 6/2000 | Jeckeln et al. |
| 6,081,158 A | 6/2000 | Twitchell et al. |
| 6,091,941 A | 7/2000 | Moriyama et al. |
| 6,112,086 A | 8/2000 | Wala |
| 6,124,758 A | 9/2000 | Korte et al. |
| 6,141,390 A | 10/2000 | Cova |
| 6,166,601 A * | 12/2000 | Shalom ............... H03F 1/3229 330/149 |
| 6,208,698 B1 | 3/2001 | Marchesani et al. |
| 6,215,354 B1 | 4/2001 | Kolanek et al. |
| 6,236,267 B1 | 5/2001 | Anzil |
| 6,240,144 B1 | 5/2001 | Ha |
| 6,242,979 B1 | 6/2001 | Li |
| 6,246,286 B1 | 6/2001 | Persson |
| 6,246,865 B1 | 6/2001 | Lee |
| 6,252,912 B1 | 6/2001 | Salinger |
| 6,253,094 B1 | 6/2001 | Schmutz |
| 6,266,531 B1 | 7/2001 | Zadeh et al. |
| 6,275,685 B1 | 8/2001 | Wessel et al. |
| 6,288,610 B1 | 9/2001 | Miyashita |
| 6,301,579 B1 | 10/2001 | Becker |
| 6,313,703 B1 | 11/2001 | Wright et al. |
| 6,314,142 B1 | 11/2001 | Perthold et al. |
| 6,315,189 B1 | 11/2001 | Williams |
| 6,320,463 B1 | 11/2001 | Leva et al. |
| 6,351,189 B1 | 2/2002 | Hirvilampi |
| 6,353,600 B1 | 3/2002 | Schwartz et al. |
| 6,356,146 B1 | 3/2002 | Wright et al. |
| 6,356,369 B1 | 3/2002 | Farhan |
| 6,356,555 B1 | 3/2002 | Rakib et al. |
| 6,359,504 B1 | 3/2002 | Cozzarelli |
| 6,373,611 B1 | 4/2002 | Farhan et al. |
| 6,373,902 B1 | 4/2002 | Park et al. |
| 6,388,518 B1 | 5/2002 | Miyatani |
| 6,393,007 B1 | 5/2002 | Haartsen |
| 6,400,774 B1 | 6/2002 | Matsuoka et al. |
| 6,424,225 B1 | 7/2002 | Choi et al. |
| 6,430,402 B1 | 8/2002 | Agahi-Kesheh |
| 6,437,644 B1 | 8/2002 | Kenington |
| 6,489,846 B2 | 12/2002 | Hatsugai |

(56) References Cited

U.S. PATENT DOCUMENTS

| | | | |
|---|---|---|---|
| 6,493,335 B1 | 12/2002 | Darcie et al. |
| 6,512,417 B2 | 1/2003 | Booth et al. |
| 6,549,067 B1 | 4/2003 | Kenington |
| 6,552,609 B2 | 4/2003 | Hamada et al. |
| 6,552,634 B1 | 4/2003 | Raab |
| 6,566,944 B1 | 5/2003 | Pehlke et al. |
| 6,587,514 B1 | 7/2003 | Wright et al. |
| 6,591,090 B1 | 7/2003 | Vuorio et al. |
| 6,594,496 B2 | 7/2003 | Schwartz |
| 6,600,406 B1 | 7/2003 | Ha |
| 6,600,792 B2 | 7/2003 | Antonio et al. |
| 6,614,854 B1 | 9/2003 | Chow et al. |
| 6,625,429 B1 | 9/2003 | Yamashita |
| 6,639,050 B1 | 10/2003 | Kieliszewski |
| 6,639,463 B1 | 10/2003 | Ghanadan et al. |
| 6,639,466 B2 | 10/2003 | Johnson |
| 6,639,950 B1 | 10/2003 | Lagerblom et al. |
| 6,657,993 B1 | 12/2003 | Casanova et al. |
| 6,677,870 B2 | 1/2004 | Im et al. |
| 6,697,436 B1 | 2/2004 | Wright et al. |
| 6,697,603 B1 | 2/2004 | Lovinggood et al. |
| 6,703,897 B2 | 3/2004 | O'Flaherty et al. |
| 6,704,545 B1 | 3/2004 | Wala |
| 6,724,737 B1 | 4/2004 | Boyden et al. |
| 6,741,662 B1 | 5/2004 | Francos et al. |
| 6,741,663 B1 | 5/2004 | Tapio et al. |
| 6,741,867 B1 | 5/2004 | Tetsuya |
| 6,747,649 B1 | 6/2004 | Sanz-Pastor et al. |
| 6,751,447 B1 * | 6/2004 | Jin ................ H04L 27/368 455/114.3 |
| 6,785,558 B1 | 8/2004 | Stratford et al. |
| 6,794,931 B2 | 9/2004 | Kenington |
| 6,801,767 B1 | 10/2004 | Schwartz et al. |
| 6,804,540 B1 | 10/2004 | Shepherd et al. |
| 6,826,164 B2 | 11/2004 | Mani et al. |
| 6,831,901 B2 | 12/2004 | Millar |
| 6,836,660 B1 | 12/2004 | Wala |
| 6,885,241 B2 | 4/2005 | Huang et al. |
| 6,898,252 B1 | 5/2005 | Yellin et al. |
| 6,907,085 B2 | 6/2005 | Kubo et al. |
| 6,963,242 B2 | 11/2005 | White et al. |
| 6,963,552 B2 | 11/2005 | Sabat, Jr. et al. |
| 6,973,139 B2 | 12/2005 | Ahn et al. |
| 6,980,527 B1 | 12/2005 | Liu et al. |
| 6,983,025 B2 | 1/2006 | Schell |
| 6,985,704 B2 | 1/2006 | Yang et al. |
| 6,998,909 B1 | 2/2006 | Mauer |
| 7,023,273 B2 | 4/2006 | Johnson et al. |
| 7,031,749 B1 | 4/2006 | Mitama |
| 7,034,612 B2 | 4/2006 | Kim |
| 7,035,345 B2 | 4/2006 | Jeckeln et al. |
| 7,042,287 B2 | 4/2006 | Robinson |
| 7,061,314 B2 | 6/2006 | Kwon et al. |
| 7,064,606 B2 | 6/2006 | Louis |
| 7,068,984 B2 | 6/2006 | Mathe et al. |
| 7,071,777 B2 | 7/2006 | McBeath et al. |
| 7,079,818 B2 | 7/2006 | Khorram |
| 7,098,734 B2 | 8/2006 | Hongo et al. |
| 7,102,442 B2 | 9/2006 | Anderson |
| 7,103,329 B1 | 9/2006 | Thon |
| 7,104,310 B2 | 9/2006 | Hunter |
| 7,106,806 B1 | 9/2006 | Kenington |
| 7,109,792 B2 | 9/2006 | Leffel |
| 7,109,998 B2 | 9/2006 | Smith |
| 7,123,890 B2 | 10/2006 | Kenington et al. |
| 7,145,704 B1 | 12/2006 | Islam |
| 7,151,913 B2 | 12/2006 | Ahmed |
| 7,158,765 B2 | 1/2007 | Blair et al. |
| 7,190,222 B2 | 3/2007 | Okazaki et al. |
| 7,193,471 B2 | 3/2007 | Tsutsui et al. |
| 7,193,472 B2 | 3/2007 | Gotou et al. |
| 7,197,085 B1 | 3/2007 | Vella-Coleiro |
| 7,248,642 B1 | 7/2007 | Vella-Coleiro |
| 7,251,293 B2 | 7/2007 | Vella-Coleiro |
| 7,257,328 B2 | 8/2007 | Levinson et al. |
| 7,259,630 B2 | 8/2007 | Bachman, II et al. |
| 7,283,519 B2 | 10/2007 | Girard |
| 7,286,507 B1 | 10/2007 | Oh et al. |
| 7,301,402 B2 | 11/2007 | Norris et al. |
| 7,321,635 B2 | 1/2008 | Ocenasek et al. |
| 7,321,636 B2 | 1/2008 | Harel et al. |
| 7,333,559 B2 | 2/2008 | Song et al. |
| 7,339,891 B2 | 3/2008 | Binder et al. |
| 7,339,897 B2 | 3/2008 | Larsson et al. |
| 7,362,776 B2 | 4/2008 | Meier et al. |
| 7,372,918 B2 | 5/2008 | Muller et al. |
| 7,409,007 B1 | 8/2008 | Johnson et al. |
| 7,469,491 B2 | 12/2008 | McCallister et al. |
| 7,489,632 B2 | 2/2009 | Lakkakorpi |
| 7,493,094 B2 | 2/2009 | Ichitsubo et al. |
| 7,496,367 B1 | 2/2009 | Ozturk et al. |
| 7,593,710 B2 | 9/2009 | Brigaud et al. |
| 7,610,460 B2 | 10/2009 | Watanabe et al. |
| 7,634,536 B2 | 12/2009 | Halasz |
| 7,639,982 B2 | 12/2009 | Wala |
| 7,650,112 B2 | 1/2010 | Utsumi et al. |
| 7,702,300 B1 | 4/2010 | McCune |
| 7,765,294 B2 | 7/2010 | Edwards et al. |
| 7,787,854 B2 | 8/2010 | Conyers et al. |
| 7,801,038 B2 | 9/2010 | Liao et al. |
| 7,826,369 B2 | 11/2010 | Filsfils et al. |
| 7,826,810 B2 | 11/2010 | Carmel et al. |
| 7,831,221 B2 | 11/2010 | Leffel et al. |
| 7,848,747 B2 | 12/2010 | Wala |
| 7,848,770 B2 | 12/2010 | Scheinert |
| 7,855,977 B2 | 12/2010 | Morrison et al. |
| RE42,287 E | 4/2011 | Apodaca et al. |
| 3,010,116 A1 | 8/2011 | Scheinert |
| 8,010,099 B2 | 8/2011 | Ma et al. |
| 8,032,148 B2 | 10/2011 | Hettstedt et al. |
| 8,036,226 B1 | 10/2011 | Ma et al. |
| 8,064,850 B2 | 11/2011 | Yang et al. |
| 8,098,572 B2 | 1/2012 | Zhou et al. |
| 8,112,094 B1 | 2/2012 | Wellington |
| 8,139,492 B1 | 3/2012 | Peterson et al. |
| 8,149,950 B2 | 4/2012 | Kim et al. |
| 8,213,401 B2 | 7/2012 | Fischer et al. |
| 8,213,884 B2 | 7/2012 | Kim et al. |
| 8,274,332 B2 | 9/2012 | Cho et al. |
| 8,326,218 B2 | 12/2012 | Wala |
| 8,326,238 B2 | 12/2012 | Yang et al. |
| 8,346,091 B2 | 1/2013 | Kummetz et al. |
| 8,346,160 B2 | 1/2013 | Kummetz |
| 8,351,877 B2 | 1/2013 | Kim et al. |
| 8,363,628 B2 | 1/2013 | Chi et al. |
| 8,369,272 B2 | 2/2013 | Barbaresi et al. |
| 8,380,143 B2 | 2/2013 | Yang et al. |
| 8,401,499 B2 | 3/2013 | Kim et al. |
| 8,446,530 B2 | 5/2013 | Bellers |
| 8,451,735 B2 | 5/2013 | Li |
| 8,472,897 B1 | 6/2013 | Yang |
| 8,478,331 B1 | 7/2013 | Rogers et al. |
| 8,509,347 B2 | 8/2013 | Kim et al. |
| 8,520,603 B2 | 8/2013 | Kozisek et al. |
| 8,527,003 B2 | 9/2013 | Gupta et al. |
| 8,532,242 B2 | 9/2013 | Fischer et al. |
| 8,542,768 B2 | 9/2013 | Kim et al. |
| 8,548,403 B2 | 10/2013 | Kim et al. |
| 8,548,526 B2 | 10/2013 | Schmidt et al. |
| 8,577,286 B2 | 11/2013 | Wala |
| 8,583,100 B2 | 11/2013 | Koziy et al. |
| 8,620,234 B2 | 12/2013 | Yang et al. |
| 8,681,917 B2 | 3/2014 | McAllister et al. |
| 8,682,338 B2 | 3/2014 | Lemson et al. |
| 8,730,786 B2 | 5/2014 | Wang et al. |
| 8,731,495 B2 | 5/2014 | Yang et al. |
| 8,737,300 B2 | 5/2014 | Stapleton et al. |
| 8,737,454 B2 | 5/2014 | Wala et al. |
| 8,804,870 B2 | 8/2014 | Kim et al. |
| 8,811,917 B2 | 8/2014 | Kim et al. |
| 8,842,649 B2 | 9/2014 | Liu et al. |
| 8,855,489 B2 | 10/2014 | Boldi et al. |
| 8,958,789 B2 | 2/2015 | Bauman et al. |
| 9,026,067 B2 | 5/2015 | Stapleton et al. |

(56) References Cited

U.S. PATENT DOCUMENTS

| | | |
|---|---|---|
| 9,031,521 B2 | 5/2015 | Yang et al. |
| 9,054,758 B2 | 6/2015 | Yang et al. |
| 9,077,297 B2 | 7/2015 | Yang et al. |
| 9,137,078 B2 | 9/2015 | Stapleton et al. |
| 9,148,324 B2 | 9/2015 | Stapleton et al. |
| 9,374,196 B2 | 6/2016 | Yang et al. |
| 9,419,714 B2 | 8/2016 | Lemson et al. |
| 9,419,837 B2 | 8/2016 | Stapleton et al. |
| 9,531,473 B2 | 12/2016 | Lemson et al. |
| 9,742,446 B2 | 8/2017 | Yang et al. |
| 9,768,739 B2 | 9/2017 | Kim et al. |
| 9,820,171 B2 | 11/2017 | Lemson et al. |
| 10,045,314 B2 | 8/2018 | Stapleton et al. |
| 10,080,178 B2 | 9/2018 | Stapleton et al. |
| 10,097,142 B2 | 10/2018 | Yang et al. |
| 10,159,074 B2 | 12/2018 | Lemson et al. |
| 10,305,521 B2 | 5/2019 | Yang et al. |
| 10,334,499 B2 | 6/2019 | Stapleton et al. |
| 10,693,425 B2 | 6/2020 | Yang et al. |
| 2001/0005402 A1 | 6/2001 | Nagatani et al. |
| 2001/0034223 A1 | 10/2001 | Rieser et al. |
| 2001/0051504 A1 | 12/2001 | Kubo et al. |
| 2002/0024398 A1 | 2/2002 | Lagerblom et al. |
| 2002/0025790 A1 | 2/2002 | Matsuoka |
| 2002/0034260 A1 | 3/2002 | Kim |
| 2002/0041208 A1 | 4/2002 | Hamada et al. |
| 2002/0041209 A1 | 4/2002 | Miyatani |
| 2002/0044014 A1 | 4/2002 | Wright et al. |
| 2002/0075906 A1 | 6/2002 | Cole et al. |
| 2002/0080891 A1 | 6/2002 | Ahn et al. |
| 2002/0086675 A1 | 7/2002 | Mansour |
| 2002/0093926 A1 | 7/2002 | Kilfoyle |
| 2002/0097085 A1 | 7/2002 | Stapleton |
| 2002/0101937 A1 | 8/2002 | Antonio et al. |
| 2002/0101938 A1 | 8/2002 | Horaguchi et al. |
| 2002/0158689 A1 | 10/2002 | Harris et al. |
| 2002/0179830 A1 | 12/2002 | Pearson et al. |
| 2002/0186436 A1 | 12/2002 | Mani et al. |
| 2002/0186783 A1 | 12/2002 | Opas et al. |
| 2002/0187761 A1 | 12/2002 | Im et al. |
| 2002/0187809 A1 | 12/2002 | Mani et al. |
| 2002/0191565 A1 | 12/2002 | Mani et al. |
| 2002/0191710 A1 | 12/2002 | Jeckeln et al. |
| 2002/0193085 A1 | 12/2002 | Mathe et al. |
| 2002/0193087 A1 | 12/2002 | Kim |
| 2003/0021263 A1 | 1/2003 | Lee |
| 2003/0021278 A1 | 1/2003 | Domschitz et al. |
| 2003/0035494 A1 | 2/2003 | Bauder et al. |
| 2003/0058959 A1 | 3/2003 | Rafie et al. |
| 2003/0095608 A1 | 5/2003 | Dupenay |
| 2003/0098752 A1 | 5/2003 | Haghighat |
| 2003/0104792 A1 | 6/2003 | Doi |
| 2003/0112068 A1 | 6/2003 | Kenington |
| 2003/0137932 A1 | 7/2003 | Nishioka et al. |
| 2003/0143947 A1 | 7/2003 | Lyu |
| 2003/0146787 A1 | 8/2003 | Hedberg et al. |
| 2003/0179829 A1 | 9/2003 | Pinckley et al. |
| 2003/0179830 A1 | 9/2003 | Eidson et al. |
| 2003/0181221 A1 | 9/2003 | Nguyen |
| 2003/0207680 A1 | 11/2003 | Yang et al. |
| 2003/0227981 A1 | 12/2003 | Vella-Coleiro et al. |
| 2003/0228856 A1 | 12/2003 | Orihashi et al. |
| 2003/0234688 A1 | 12/2003 | Matsuyoshi et al. |
| 2004/0017859 A1 | 1/2004 | Sills et al. |
| 2004/0032912 A1 | 2/2004 | Ocenasek et al. |
| 2004/0053624 A1 | 3/2004 | Frank et al. |
| 2004/0105509 A1 | 6/2004 | McGowan et al. |
| 2004/0136470 A1 | 7/2004 | DeBruyn et al. |
| 2004/0142667 A1 | 7/2004 | Lohhead et al. |
| 2004/0179587 A1 | 9/2004 | Kenington et al. |
| 2004/0180634 A1 | 9/2004 | Kenington et al. |
| 2004/0183672 A1 | 9/2004 | Krishan et al. |
| 2004/0203542 A1 | 10/2004 | Seo et al. |
| 2004/0208259 A1 | 10/2004 | Hunton |
| 2004/0212428 A1 | 10/2004 | Ode et al. |
| 2004/0240585 A1 | 12/2004 | Bishop et al. |
| 2004/0247042 A1 | 12/2004 | Sahlman |
| 2005/0008096 A1 | 1/2005 | Iwasaki et al. |
| 2005/0059360 A1 | 3/2005 | Kenington |
| 2005/0068102 A1 | 3/2005 | Hongo et al. |
| 2005/0079834 A1 | 4/2005 | Maniwa et al. |
| 2005/0143091 A1 | 6/2005 | Shapira et al. |
| 2005/0152695 A1 | 7/2005 | Sulzberger et al. |
| 2005/0157675 A1 | 7/2005 | Feder et al. |
| 2005/0157814 A1 | 7/2005 | Cova et al. |
| 2005/0159117 A1 | 7/2005 | Bausov et al. |
| 2005/0164667 A1 | 7/2005 | Pan et al. |
| 2005/0174954 A1 | 8/2005 | Yun et al. |
| 2005/0180526 A1 | 8/2005 | Kim et al. |
| 2005/0180527 A1 | 8/2005 | Suzuki et al. |
| 2005/0181812 A1 | 8/2005 | Scheck |
| 2005/0190857 A1 | 9/2005 | Braithwaite |
| 2005/0195919 A1 | 9/2005 | Cova |
| 2005/0206564 A1 | 9/2005 | Mao et al. |
| 2005/0220066 A1 | 10/2005 | Wal et al. |
| 2005/0226346 A1 | 10/2005 | Ode et al. |
| 2005/0253652 A1 | 11/2005 | Song et al. |
| 2005/0258898 A1 | 11/2005 | Hongo |
| 2005/0262498 A1 | 11/2005 | Ferguson et al. |
| 2006/0012426 A1 | 1/2006 | Nezami |
| 2006/0012427 A1 | 1/2006 | Nezami |
| 2006/0046665 A1 | 3/2006 | Yang et al. |
| 2006/0067426 A1 | 3/2006 | Maltsev et al. |
| 2006/0094470 A1 | 5/2006 | Wake et al. |
| 2006/0109052 A1 | 5/2006 | Saed et al. |
| 2006/0121858 A1 | 6/2006 | Tanaka et al. |
| 2006/0121944 A1 | 6/2006 | Buscaglia et al. |
| 2006/0141957 A1 | 6/2006 | Fischer et al. |
| 2006/0214729 A1 | 9/2006 | Furuya et al. |
| 2006/0217083 A1 | 9/2006 | Braithwaite |
| 2006/0226903 A1 | 10/2006 | Muller et al. |
| 2006/0238245 A1 | 10/2006 | Carichner et al. |
| 2006/0239266 A1 | 10/2006 | Babbar et al. |
| 2006/0240786 A1 | 10/2006 | Liu |
| 2006/0262880 A1 | 11/2006 | Mizuta et al. |
| 2006/0270366 A1 | 11/2006 | Rozenblit et al. |
| 2006/0276147 A1 | 12/2006 | Suzuki et al. |
| 2007/0019598 A1 | 1/2007 | Prehofer |
| 2007/0057737 A1 | 3/2007 | Davis et al. |
| 2007/0058742 A1 | 3/2007 | Demarco et al. |
| 2007/0064506 A1 | 3/2007 | Bauman et al. |
| 2007/0065078 A1 | 3/2007 | Jiang |
| 2007/0066234 A1 | 3/2007 | Lastinger et al. |
| 2007/0075780 A1 | 4/2007 | Krvavac et al. |
| 2007/0116046 A1 | 5/2007 | Liu et al. |
| 2007/0121543 A1 | 5/2007 | Kuchibhotla et al. |
| 2007/0135065 A1 | 6/2007 | Leffel et al. |
| 2007/0147488 A1 | 6/2007 | Han |
| 2007/0171234 A1 | 7/2007 | Crawfis et al. |
| 2007/0177552 A1 | 8/2007 | Wu et al. |
| 2007/0190952 A1 | 8/2007 | Waheed et al. |
| 2007/0223614 A1 | 9/2007 | Kuchibhotla et al. |
| 2007/0241812 A1 | 10/2007 | Yang et al. |
| 2007/0264947 A1 | 11/2007 | Rozenblit et al. |
| 2007/0273439 A1 | 11/2007 | Lin et al. |
| 2007/0281643 A1 | 12/2007 | Kawai |
| 2007/0296494 A1 | 12/2007 | Hongo |
| 2008/0031380 A1 | 2/2008 | Takabayashi |
| 2008/0045254 A1 | 2/2008 | Gupta et al. |
| 2008/0051129 A1 | 2/2008 | Abe et al. |
| 2008/0058018 A1 | 3/2008 | Scheinert |
| 2008/0068191 A1 | 3/2008 | Maeda et al. |
| 2008/0069032 A1 | 3/2008 | Liu |
| 2008/0070632 A1 | 3/2008 | Obuchi et al. |
| 2008/0089689 A1 | 4/2008 | Sakama |
| 2008/0094139 A1 | 4/2008 | Takano et al. |
| 2008/0107014 A1 | 5/2008 | Huang et al. |
| 2008/0119198 A1 | 5/2008 | Hettstedt et al. |
| 2008/0139140 A1 | 6/2008 | Matero et al. |
| 2008/0146146 A1 | 6/2008 | Binder et al. |
| 2008/0152037 A1 | 6/2008 | Kim et al. |
| 2008/0165882 A1 | 7/2008 | Hedayat et al. |
| 2008/0225816 A1 | 9/2008 | Osterling et al. |
| 2008/0240036 A1 | 10/2008 | Liu et al. |

(56) References Cited

U.S. PATENT DOCUMENTS

| | | |
|---|---|---|
| 2008/0240286 A1 | 10/2008 | Zhang et al. |
| 2008/0265996 A1 | 10/2008 | Kim et al. |
| 2009/0003196 A1 | 1/2009 | Capece et al. |
| 2009/0013317 A1 | 1/2009 | Abfalter et al. |
| 2009/0046586 A1 | 2/2009 | Stuart et al. |
| 2009/0060088 A1 | 3/2009 | Callard et al. |
| 2009/0060496 A1 | 3/2009 | Liu et al. |
| 2009/0082010 A1 | 3/2009 | Lee et al. |
| 2009/0088093 A1 | 4/2009 | Nentwig |
| 2009/0146736 A1 | 6/2009 | Kim et al. |
| 2009/0146870 A1 | 6/2009 | Thome et al. |
| 2009/0154621 A1 | 6/2009 | Shapira et al. |
| 2009/0170543 A1 | 7/2009 | Mostafa et al. |
| 2009/0180407 A1 | 7/2009 | Sabt et al. |
| 2009/0180426 A1 | 7/2009 | Sabat et al. |
| 2009/0180462 A1 | 7/2009 | Duerdodt et al. |
| 2009/0191891 A1 | 7/2009 | Ma et al. |
| 2009/0213972 A1 | 8/2009 | Maunuksela et al. |
| 2009/0238566 A1 | 9/2009 | Boldi et al. |
| 2009/0252094 A1 | 10/2009 | Chang et al. |
| 2009/0252136 A1 | 10/2009 | Mahany et al. |
| 2009/0274048 A1 | 11/2009 | Sambhwani et al. |
| 2009/0274085 A1 | 11/2009 | Wang et al. |
| 2009/0286484 A1 | 11/2009 | Phung et al. |
| 2010/0002661 A1 | 1/2010 | Schmidt et al. |
| 2010/0075678 A1 | 3/2010 | Akman et al. |
| 2010/0087227 A1 | 4/2010 | Francos et al. |
| 2010/0112981 A1 | 5/2010 | Suh et al. |
| 2010/0118921 A1 | 5/2010 | Abdelmonem et al. |
| 2010/0128676 A1 | 5/2010 | Wu et al. |
| 2010/0130130 A1 | 5/2010 | Liu |
| 2010/0136932 A1 | 6/2010 | Osterling et al. |
| 2010/0136998 A1 | 6/2010 | Lott et al. |
| 2010/0157901 A1 | 6/2010 | Sanderovitz et al. |
| 2010/0177759 A1 | 7/2010 | Fischer et al. |
| 2010/0177760 A1 | 7/2010 | Cannon et al. |
| 2010/0178936 A1 | 7/2010 | Wala et al. |
| 2010/0182984 A1 | 7/2010 | Herscovici et al. |
| 2010/0202565 A1 | 8/2010 | Abbasfar |
| 2010/0238904 A1 | 9/2010 | Zhang et al. |
| 2010/0247105 A1 | 9/2010 | Yu |
| 2010/0271957 A1 | 10/2010 | Stapleton et al. |
| 2010/0278530 A1 | 11/2010 | Kummetz et al. |
| 2010/0279704 A1 | 11/2010 | Vachhani |
| 2010/0291949 A1 | 11/2010 | Shapira et al. |
| 2010/0296816 A1 | 11/2010 | Larsen |
| 2010/0299173 A1 | 11/2010 | Zampiello et al. |
| 2010/0304773 A1 | 12/2010 | Ramprashad |
| 2010/0311372 A1 | 12/2010 | Bouyaud et al. |
| 2010/0324814 A1 | 12/2010 | Wu et al. |
| 2011/0009056 A1 | 1/2011 | Hanson et al. |
| 2011/0069657 A1 | 3/2011 | Gholmieh et al. |
| 2011/0103309 A1 | 5/2011 | Wang et al. |
| 2011/0135013 A1 | 6/2011 | Wegener |
| 2011/0135308 A1 | 6/2011 | Tarlazzi et al. |
| 2011/0158116 A1 | 6/2011 | Tenny et al. |
| 2011/0195673 A1 | 8/2011 | Pratt et al. |
| 2011/0223958 A1 | 9/2011 | Chen et al. |
| 2011/0237178 A1 | 9/2011 | Seki et al. |
| 2011/0241425 A1 | 10/2011 | Hunter, Jr. et al. |
| 2011/0249708 A1 | 10/2011 | Maca |
| 2011/0281579 A1 | 11/2011 | Kummetz |
| 2011/0287791 A1 | 11/2011 | Fujishima et al. |
| 2012/0002586 A1 | 1/2012 | Gainey et al. |
| 2012/0039254 A1 | 2/2012 | Stapleton et al. |
| 2012/0057572 A1 | 3/2012 | Evans et al. |
| 2012/0127938 A1 | 5/2012 | Lv et al. |
| 2012/0147993 A1 | 6/2012 | Kim et al. |
| 2012/0150521 A1 | 6/2012 | Balkwill |
| 2012/0230382 A1 | 9/2012 | Kim et al. |
| 2012/0281565 A1 | 11/2012 | Sauer |
| 2013/0214861 A1 | 8/2013 | Kim et al. |
| 2013/0272202 A1 | 10/2013 | Stapleton et al. |
| 2013/0315291 A1 | 11/2013 | Kim et al. |
| 2014/0126914 A1 | 5/2014 | Berlin et al. |
| 2014/0286247 A1 | 9/2014 | Lemson et al. |
| 2014/0313884 A1 | 10/2014 | Stapleton et al. |
| 2014/0327481 A1 | 11/2014 | Kim et al. |
| 2015/0092830 A1 | 4/2015 | Kim et al. |
| 2016/0014782 A1 | 1/2016 | Stapleton et al. |
| 2016/0080082 A1 | 3/2016 | Lemson et al. |
| 2016/0269210 A1 | 9/2016 | Kim et al. |
| 2017/0033969 A1 | 2/2017 | Yang et al. |
| 2017/0055198 A1 | 2/2017 | Stapleton et al. |
| 2017/0070897 A1 | 3/2017 | Lemson et al. |
| 2017/0181008 A1 | 6/2017 | Fischer |
| 2017/0214420 A1 | 7/2017 | Phillips et al. |
| 2017/0238318 A1 | 8/2017 | Lemson et al. |
| 2018/0102747 A1 | 4/2018 | Kim et al. |
| 2018/0279197 A1 | 9/2018 | Kim et al. |
| 2019/0208523 A1 | 7/2019 | Lemson et al. |
| 2019/0288900 A1 | 9/2019 | Yang et al. |
| 2020/0083914 A1 | 3/2020 | Yang et al. |
| 2020/0092787 A1 | 3/2020 | Stapleton et al. |
| 2020/0146015 A1 | 5/2020 | Lemson et al. |
| 2020/0169937 A1 | 5/2020 | Kim et al. |
| 2020/0267732 A1 | 8/2020 | Lemson et al. |

FOREIGN PATENT DOCUMENTS

| | | |
|---|---|---|
| CN | 1349679 A | 5/2002 |
| CN | 1462153 A | 12/2003 |
| CN | 1518209 A | 8/2004 |
| CN | 1531213 | 9/2004 |
| CN | 1578119 A | 2/2005 |
| CN | 1605152 A | 4/2005 |
| CN | 1640086 A | 7/2005 |
| CN | 1652520 A | 8/2005 |
| CN | 1700591 A | 11/2005 |
| CN | 1774094 A | 5/2006 |
| CN | 1838530 A | 6/2006 |
| CN | 1866731 A | 11/2006 |
| CN | 1983801 A | 6/2007 |
| CN | 100341292 C | 10/2007 |
| CN | 201127027 Y | 10/2008 |
| CN | 101394647 A | 3/2009 |
| CN | 101453699 A | 6/2009 |
| CN | 101453799 A | 6/2009 |
| CN | 101521893 A | 9/2009 |
| CN | 101523969 A | 9/2009 |
| CN | 201307942 Y | 9/2009 |
| CN | 101621806 A | 1/2010 |
| CN | 101754229 A | 6/2010 |
| CN | 101754431 A | 6/2010 |
| CN | 102460385 A | 5/2012 |
| CN | 103201958 A | 7/2013 |
| CN | 104202279 A | 12/2014 |
| EP | 0 368 673 A1 | 5/1990 |
| EP | 0 642 243 A1 | 3/1995 |
| EP | 1 118 234 A1 | 7/2001 |
| EP | 1 566 979 A1 | 8/2005 |
| EP | 1798853 A | 6/2007 |
| EP | 2430531 A1 | 3/2012 |
| IN | 8527/CHENP/2011 A | 3/2013 |
| JP | 1992-207532 A | 7/1992 |
| JP | 1993-136724 A | 1/1993 |
| JP | H09-284149 A | 10/1997 |
| JP | 2000-092412 A | 3/2000 |
| JP | 2000-512107 A | 9/2000 |
| JP | 2000-278237 A | 10/2000 |
| JP | 2001-268032 A | 6/2001 |
| JP | 2001-508954 A | 7/2001 |
| JP | 2001-217885 | 8/2001 |
| JP | 2001-244757 A | 9/2001 |
| JP | 2002-158615 A | 5/2002 |
| JP | 2002-536902 A | 10/2002 |
| JP | 2003-168931 A | 6/2003 |
| JP | 2003-304122 A | 10/2003 |
| JP | 2004-015364 A | 1/2004 |
| JP | 2004-147009 A | 5/2004 |
| JP | 2005-020675 A | 1/2005 |
| JP | 2005-033632 A | 2/2005 |
| JP | 2005-101908 A | 4/2005 |
| JP | 2005-150932 A | 6/2005 |

(56) References Cited

FOREIGN PATENT DOCUMENTS

| | | |
|---|---|---|
| JP | 2005-217714 A | 8/2005 |
| JP | 2005-333353 A | 12/2005 |
| JP | 2006-505160 A | 2/2006 |
| JP | 2006-340166 A | 12/2006 |
| JP | 2007-006163 A | 1/2007 |
| JP | 2007-020157 A | 1/2007 |
| JP | 2007-104018 A | 4/2007 |
| JP | 2007-195056 A | 8/2007 |
| JP | 2007-523577 A | 8/2007 |
| JP | 2007-235738 A | 9/2007 |
| JP | 2008-135955 A | 6/2008 |
| JP | 2009-038688 A | 2/2009 |
| JP | 2009-296335 A | 12/2009 |
| JP | 2010-166531 A | 7/2010 |
| JP | 2012-525093 A | 10/2012 |
| JP | 2018-064298 A | 4/2018 |
| KR | 10-1996-0702978 A | 5/1996 |
| KR | 10-2000-0016621 | 3/2000 |
| KR | 2000-0039780 | 7/2000 |
| KR | 10-2004-0054420 | 6/2004 |
| KR | 10-2005-0006725 | 1/2005 |
| KR | 10-2005-0052556 | 6/2005 |
| KR | 10-2006-0109997 A | 10/2006 |
| KR | 2009-0088083 A | 8/2009 |
| KR | 10-2010-017270 A | 2/2010 |
| KR | 10-2014-0026321 A | 3/2014 |
| KR | 101874655 B1 | 7/2018 |
| TW | I 261419 B | 9/2006 |
| WO | WO 97/48181 | 12/1997 |
| WO | 98/24256 A2 | 6/1998 |
| WO | 0019750 A1 | 4/2000 |
| WO | WO 00/46916 | 8/2000 |
| WO | WO 01/08296 | 2/2001 |
| WO | 01/56197 A2 | 8/2001 |
| WO | 02/23956 A2 | 3/2002 |
| WO | 02/102102 A1 | 12/2002 |
| WO | WO 2004/040870 | 5/2004 |
| WO | WO 2005/076495 | 8/2005 |
| WO | WO 2006/025213 | 3/2006 |
| WO | 2006/040653 A1 | 4/2006 |
| WO | WO 2006/087864 | 8/2006 |
| WO | WO 2006/102278 | 9/2006 |
| WO | WO 2007/004252 | 1/2007 |
| WO | 2007/127543 A2 | 11/2007 |
| WO | 2008/036976 A2 | 3/2008 |
| WO | WO 2008/078195 | 7/2008 |
| WO | WO 2008/105775 | 9/2008 |
| WO | 2008/146394 A1 | 12/2008 |
| WO | WO 2008/154077 | 12/2008 |
| WO | WO 2008/155610 | 12/2008 |
| WO | WO 2009/109808 | 9/2009 |
| WO | 2010/008794 A2 | 1/2010 |
| WO | 2010/124297 A1 | 10/2010 |
| WO | WO 2010/124297 | 10/2010 |
| WO | 2010/133942 A1 | 11/2010 |
| WO | 2012/024343 A1 | 2/2012 |
| WO | 2012/024345 A2 | 2/2012 |
| WO | 2012/024349 A1 | 2/2012 |

OTHER PUBLICATIONS

Translation of First Office Action for Chinese Application No. 200780051434.2, dated Mar. 6, 2013.
Second Office Action (Including Translation) for Chinese Application No. 200780051434.2, dated Jan. 2, 2014.
Board Decision (Including Translation) for Chinese Application No. 201410462933.2, dated Sep. 28, 2020.
Notice of Allowance for U.S. Appl. No. 16/230,750, dated Dec. 14, 2020.
Office Action for U.S. Appl. No. 16/388,680, dated Oct. 30, 2020, 2020.
Office Action for U.S. Appl. No. 16/901,116, dated Sep. 22, 2020.
Office Action for U.S. Appl. No. 11/961,969, dated Sep. 23, 2010.
Office Action for U.S. Appl. No. 11/961,969, dated May 10, 2011.
Notice of Allowance for U.S. Appl. No. 11/961,969, dated Nov. 25, 2011.
Office Action for U.S. Appl. No. 13/404,679, dated Aug. 28, 2012.
Notice of Allowance for U.S. Appl. No. 13/404,679, dated Feb. 5, 2013.
Office Action for U.S. Appl. No. 13/887,133, dated Nov. 7, 2013.
Notice of Allowance for U.S. Appl. No. 13/887,133, dated Jun. 6, 2014.
Office Action for U.S. Appl. No. 14/480,285, dated Jan. 30, 2015.
Notice of Allowance for U.S. Appl. No. 14/480,285, dated Sep. 16, 2015.
Office Action for U.S. Appl. No. 14/991,264 dated Jun. 30, 2016.
Office Action for U.S. Appl. No. 14/991,264 dated Apr. 28, 2017.
Notice of Allowance for U.S. Appl. No. 14/991,264 dated Oct. 19, 2017.
Office Action for U.S. Appl. No. 15/875,936 dated Oct. 5, 2018.
Office Action for U.S. Appl. No. 15/875,936 dated Apr. 2, 2019.
Office Action for U.S. Appl. No. 16/777,306 dated Jun. 23, 2020.
U.S. Appl. No. 16/901,116, filed Jun. 15, 2020, Yang et al..
U.S. Appl. No. 13/886,190, filed May 2, 2013, Yang.
U.S. Appl. No. 60/795,820, filed Apr. 28, 2006, Yang et al..
U.S. Appl. No. 60/876,640, filed Dec. 22, 2006, Yang et al..
Armstrong, J. Abstract for "Peak-to-Average Power Reduction for OFDM by Repeated Clipping and Frequency Domain Filtering" IEEE Electronics Letters; vol. 38, Issue 5; Feb. 2002.
Bernardini, A, et al. "Analysis of Different Optimization Criteria for IF Predistortion in Digital Radio Links with Nonlinear Amplifiers" IEEE Transactions on Communications; vol. 45, Issue 4; Apr. 1997.
Cavers, J.K. "Adaptive Behaviour of a Feedforward Amplifer Linearizer" IEEE Transactions on Vehicular Technology; vol. 44, No. 1; Feb. 1995.
Cavers, J.K. "Amplifier Linearization Using Digital Predistorter with Fast Adaptation and Low Memory Requirements" IEEE Transactions on Vehicular Technology; vol. 39, Issue 4; Nov. 1990.
Ding, Lei et al., "A Hammerstein Predistortion Linearization Design Based on The Indirect Learning Architecture" IEEE Int'l Conf. on Acoustics, Speech, and Signal Processing, vol. 3; 2002.
Ding, Lei "Digital Predistortion of Power Amplifiers for Wireless Applications" School of Electrical and Computer Engineering Georgia Institute of Technology; Mar. 2004.
Eun, Changsoo et al. "A New Volterra Predistorter Based on the Indirect Learning Architecture" IEEE Transactions on Signal Processing, vol. 45, No. 1, Jan. 1997.
Falukner, M., et al. "Adaptive Linearization Using Predistortion—Experimental Results" IEEE Transactions on Vehicular Technology; vol. 43, Issue 2; May 1994.
Hilborn, Derek S. et al. "An Adaptive Direct Conversion Transmitter" IEEE Transactions on Vehicular Technology; vol. 43, No. 2, May 1994.
Kim, W.J., et al. "Baseband Derived RF Digital Predistortion" Electronic Letters; Vo. 42, No. 8; Apr. 13, 2006.
Kim, Wan-Jong "Digital Predistortion Linearization and Crest Factor Reduction for Wideband Applications" 2006.
Kim, Wan-Jong et al. "Digital Predistortion Linearizes Wireless Power Amplifiers" IEEE Microwave Magazine, vol. 6, Issue 3, Sep. 2005.
Kim, Wan-Jong et al. Abstract for "Digital Predistortion of a Doherty Amplifier With a Weak Memory within a Connected Solution" IEEE 60th Vehicular Technology Conference, vol. 3, Sep. 2004.
Kim, Wan-Jong, et al. "Piecewise Pre-Equalized Linearization of the Wireless Transmitter with a Dohery Amplifier" IEEE Transactions on Microwage Theory and Techniques; vol. 54, No. 9; Sep. 2006.
Leung, S.H., et al. Abstract For "Algorithm for Repeated Clipping and Filtering in Peak-to-Average Power Reduction for OFDM" IEEE Electronic Letters; vol. 38; Issue 25; Dec. 5, 2002.
Nagata. Y. et al. "Linear Amplification Technique for Digital Mobile Communications" IEEE 39th Vehicular Technology Conference; May 1989.

(56) References Cited

OTHER PUBLICATIONS

Santella, G "Performance of Adaptive Predistorters in Presence of Othogonal Multicarrier Modulation" International Conference on Telecommunicaitons, Apr. 1997.
Stapleton, Shawn et al. "An Adaptive Predistorter for a Power Amplifier Based on Adjacent Channel Emissions" IEEE Transactions on Vehicular Technology; vol. 41, Issue 1; Feb. 1992.
Väänänen, Olli et al. "Effect of Clipping in Wdeband CDMA System and Simple Algorithm for Peak Windowing" World Wireless Congress, San Francisco; May 2002.
Yang, Y., et al. Abstract for "A Fully Matched N-Way Doherty Amplifier with Optimized Linearity" IEEE Trans. Microwave Theory Tech., vol. 51, No. 3; Mar. 2005.
International Search Report for International Application No. PCT/US2007/010566, dated Apr. 18, 2008.
Written Opinion for International Application No. PCT/US2007/010566, dated Apr. 18, 2008.
International Preliminary Report on Patentability for International Application No. PCT/US2007/010566, dated Oct. 28, 2008.
First Office Action (Including Translation) for Chinese Application No. 200780023875.1, dated Dec. 23, 2011.
Second Office Action (Including Translation) for Chinese Application No. 200780023875.1, dated Oct. 16, 2012.
European Search Report for European Patent Application No. 07861302.3, dated Nov. 25, 2009.
International Search Report for International Application No. PCT/US2008/061355, dated Aug. 4, 2008.
Written Opinion for International Application No. PCT/US2008/061355, dated Aug. 4, 2008.
International Preliminary Report on Patentability for International Application No. PCT/US2008/061355, dated Oct. 27, 2009.
First Office Action (Including Translation) for Chinese Application No. 200880021049.8, dated Mar. 28, 2012.
Second Office Action (Including Translation) for Chinese Application No. 200880021049.8, dated Dec. 4, 2012.
Third Office Action (Including Translation) for Chinese Application No. 200880021049.8, dated Jun. 20, 2013.
European Search Report for European Application No. 08/46721.3, dated Apr. 9, 2014.
Intention to Grant for European Application No. 08746721.3, dated Mar. 5, 2018.
Examination Report for Indian Patent Application No. 7544/DELNP/2009, dated Apr. 3, 2017.
Intent to Grant for Indian Patent Application No. 7544/DELNP/2009, dated Feb. 3, 2020.
Notice of Reasons for Rejection (Including Translation) for Japanese Patent Application No. 2010-506483, dated Jan. 10, 2012.
Notice of Reasons for Rejection (Including Translation) for Japanese Patent Application No. 2010-506483, dated Oct. 9, 2012.
Dismissal Decision for Amendment (Including Translation) for Rejection for Japanese Patent Application No. 2010-506483, dated Jun. 4, 2013.
Final Notice of Reasons for Rejection (Including Translation) for Japanese Patent Application No. 2010-506483, dated Dec. 17, 2013.
Decision to Grant (Including Translation) for Japanese Patent Application No. 2010-506483, dated Jul. 1, 2014.
Notification of Reason for Refusal (Including Translation) for Korean Application No. 10-2009-7024361, dated Apr. 29, 2014.
Grant of Patent (Including Translation) for Korean Application No. 10-2009-7024361, dated Dec. 22, 2014.
Notification of Reason for Refusal (Including Translation) for Korean Application No. 10-2014-7021366, dated Sep. 30, 2014.
Notification of Reason for Refusal (Including Translation) for Korean Application No. 10-2014-7021366, dated Jun. 28, 2015.
Notification of Reason for Refusal (Including Translation) for Korean Application No. 10-2014-7021366, dated Jan. 7, 2016.
Notice of Allowance (Including Translation) for Korean Application No. 10-2014-7021366, dated Sep. 27, 2016.
International Search Report for International Application No. PCT/IB2008/000996, dated Feb. 26, 2009.

Written Opinion for International Application No. PCT/IB2008/000996, dated Feb. 26, 2009.
International Preliminary Report on Patentability for International Application No. PCT/IB2008/000996, dated Jul. 28, 2009.
First Office Action (Including Translation) for Chinese Application No. 200880003130.3, dated Aug. 5, 2011.
Second Office Action (Including Translation) for Chinese Application No. 200880003130.3, dated May 3, 2012.
Third Office Action (Including Translation) for Chinese Application No. 200880003130.3, dated Jan. 11, 2013.
Fourth Office Action (Including Translation) for Chinese Application No. 200880003130.3, dated Jul. 8, 2013.
Fifth Office Action (Including Translation) for Chinese Application No. 200880003130.3, dated Dec. 24, 2013.
First Office Action (Including Translation) for Chinese Application No. 201410199319.1, dated Jul. 4, 2016.
Second Office Action (Including Translation) for Chinese Application No. 201410199319.1, dated May 18, 2017.
Third Office Action (Including Translation) for Chinese Application No. 201410199319.1, dated Jan. 31, 2018.
Notification to Grant Patent Right for Invention (Including Translation) for Chinese Application No. 201410199319.1, dated Jul. 5, 2018.
European Search Report for European Application No. 08806836.6, dated Dec. 30, 2009.
International Search Report for International Application No. PCT/IB2007/004404, dated Sep. 19, 2008.
Written Opinion for International Application No. PCT/IB2007/004404, dated Sep. 19, 2008.
International Preliminary Report on Patentability for International Application No. PCT/IB2007/004404, dated Feb. 1, 2011.
First Office Action (Including Translation) for Chinese Application No. 201410462933.2, dated Dec. 16, 2016.
Second Office Action (Including Translation) for Chinese Application No. 201410462933.2, dated Aug. 30, 2017.
Third Office Action for Chinese Application No. 201410462933.2, dated Apr. 17, 2018.
Rejection Decision for Chinese Application No. 201410462933.2, dated Mar. 15, 2019.
First Board Opinion for Chinese Application No. 201410462933.2, dated Oct. 30, 2019.
Second Board Opinion (Including Translation) for Chinese Application No. 201410462933.2, dated Apr. 27, 2020.
European Search Report for European Application No. 07870441.8, dated Feb. 26, 2014.
Intent to Grant for European Application No. 07870441.8, dated Mar. 1, 2018.
European Search Report for European Application No. 18187871.1, dated Oct. 12, 2018.
Intention to Grant for European Application No. 18187871.1, dated Apr. 29, 2020.
Examination Report for Indian Patent Application No. 4344/CHENP/2009, dated Jul. 14, 2014.
Notice of Grant for Indian Patent Application No. 4344/CHENP/2009, dated Jun. 5, 2017.
Notice of Reasons for Refusal for (Including Translation) Japanese Patent Application No. 2009-543544, dated May 8, 2012.
Notice of Reasons for Refusal (Including Translation) for Japanese Patent Application No. 2009-543544, dated Aug. 21, 2012.
Notice of Reasons for Refusal (Including Translation) for Japanese Patent Application No. 2009-543544, dated Nov. 13, 2012.
Notice of Allowance (Including Translation) for Japanese Patent Application No. 2009-543544, dated Mar. 12, 2013.
Notification of Reason for Refusal (Including Translation) for Korean Application No. 10-2009-7015697, dated Apr. 28, 2014.
Notification of Reason for Refusal (Including Translation) for Korean Application No. 10-2009-7015697, dated Oct. 17, 2014.
Notification of Reason for Refusal (Including Translation) for Korean Application No. 10-2009-7015697, dated May 22, 2015.
Notification of Final Rejection (Including Translation) for Korean Application No. 10-2009-7015697, dated Jul. 27, 2015.
Notification of Reason for Refusal (Including Translation) for Korean Application No. 10-2014-7017682, dated Aug. 26, 2014.

(56) References Cited

OTHER PUBLICATIONS

Notification of Final Rejection (Including Translation) for Korean Application No. 10-2014-7017682, dated May 28, 2015.
International Search Report for International Application No. PCT/IB2008/003944, dated Sep. 18, 2009.
Written Opinion for International Application No. PCT/IB2008/003944, dated Sep. 18, 2009.
International Preliminary Report on Patentability for International Application No. PCT/IB2008/003944, dated Mar. 22, 2011.
First Office Action (Including Translation) for Chinese Patent Application No. 2008801263242, dated May 29, 2013.
Second Office Action (Including Translation) for Chinese Patent Application No. 2008801263242, dated Apr. 11, 2014.
Notification to Grant Patent Right for Invention (Including Translation) Chinese Patent Application No. 200880126324.2, dated Aug. 10, 2016.
European Search Report for European Application No. 08873193.0, dated Apr. 29, 2014.
Office Action for European Application No. 08873193.0, dated Feb. 28, 2018.
Office Action for European Application No. 08873193.0, dated Dec. 12, 2018.
Examination Report for Indian Patent Application No. 4196/CHENP/2010, dated Sep. 26, 2017.
Decision on Hearing for Indian Patent Application No. 4196/CHENP/2010, dated Dec. 26, 2019.
Notice of Reasons for Refusal (Including Translation) for Japanese Patent Application No. 2010-536550, dated Aug. 7, 2012.
Decision to Grant a Patent (Including Translation) for Japanese Patent Application No. 2010-536550, dated Apr. 2, 2013.
Notification of Reason for Refusal (Including Translation) for Korean Application No. 10-2010-7015019, dated Oct. 24, 2014.
Notification of Reason for Refusal (Including Translation) for Korean Application No. 10-2010-7015019, dated May 26, 2015.
Notice of Allowance (Including Translation) for Korean Application No. 10-2010-7015019, dated Jan. 21, 2016.
International Search Report for International Application No. PCT/US2010/032453, dated Jun. 28, 2010.
Written Opinion for International Application No. PCT/US2010/032453, dated Jun. 28, 2010.
International Preliminary Report on Patentability for International Application No. PCT/US2010/032453, dated Nov. 3, 2011.
First Office Action (Including Translation) for Chinese Application No. 201080025887.X, dated Nov. 22, 2013.
Second Office Action (Including Translation) for Chinese Application No. 201080025887.X, dated May 29, 2014.
Third Office Action (Including Translation) for Chinese Application No. 201080025887.X, dated Dec. 2, 2014.
Fourth Office Action (Including Translation) for Chinese Application No. 201080025887.X, dated Jun. 2, 2015.
Notification to Grant Patent Right for Invention (Including Translation) for Chinese Application No. 201080025887.X, dated Nov. 17, 2015.
European Search Report for European Application No. 10767899.7, dated Mar. 14, 2013.
Office Action for European Application No. 10767899.7, dated Jun. 2, 2015.
Office Action for European Application No. 10767899.7, dated Feb. 5, 2018.
Intention to Grant for European Application No. 10767899.7, dated Dec. 6, 2018.
Intention to Grant for European Application No. 10767899.7, dated Jun. 27, 2019.
Substantive Examination Report for Indonesian Application No. W00201201448, dated Sep. 2, 2016.
Examination Report for Indian Patent Application No. 8527/CHENP/2011, dated Nov. 28, 2019.
Notice of Reasons for Rejection (including Translation) for Japanese Patent Application No. 2012-507473, dated Feb. 25, 2014.
Notice of Reasons for Rejection (Including Translation) for Japanese Patent Application No. 2012-507473, dated Dec. 2, 2014.
Decision of Refusal (Including Translation) for Japanese Patent Application No. 2012-507473, dated May 12, 2015.
Notice of Reasons for Rejection (Including Translation) for Japanese Patent Application No. 2015-178686, dated Sep. 27, 2016.
Decision of Refusal (Including Translation) for Japanese Patent Application No. 2015-178686, dated Aug. 28, 2017.
Notice of Reasons for Rejection (Including Translation) for Japanese Patent Application No. 2017-253609, dated Mar. 8, 2019.
Decision of Refusal (Including Translation) for Japanese Patent Application No. 2017-253609, dated Nov. 5, 2019.
Notification of Reasons for Refusal (Including Translation) for Korean Application No. 10-2011-7027891, dated Jul. 14, 2016.
Notification of Reasons for Refusal (Including Translation) for Korean Application No. 10-2011-7027891, dated Apr. 21, 2017.
Notification of Reasons for Refusal (Including Translation) for Korean Application No. 10-2011-7027891, dated Feb. 26, 2018.
Notification of Reasons for Refusal (Including Translation) for Korean Application No. 10-2011-7027891, dated Oct. 4, 2018.
Notice of Allowance (Including Translation) for Korean Application No. 10-2011-7027891, dated Jan. 4, 2019.
Office Action for U.S. Appl. No. 10/137,556, dated Dec. 2, 2004.
Notice of Allowance for U.S. Appl. No. 10/137,556, dated Jul. 6, 2005.
Office Action for U.S. Appl. No. 11/262,079 dated Aug. 29, 2008.
Office Action for U.S. Appl. No. 11/262,079 dated May 4, 2009.
Office Action for U.S. Appl. No. 11/262,079 dated Dec. 11, 2009.
Office Action for U.S. Appl. No. 11/262,079 dated Aug. 25, 2010.
Office Action for U.S. Appl. No. 11/262,079 dated Mar. 26, 2012.
Notice of Allowance for U.S. Appl. No. 11/262,079 dated Aug. 23, 2012.
Office Action for U.S. Appl. No. 13/619,538, dated Sep. 18, 2013.
Notice of Allowance for U.S. Appl. No. 13/619,538, dated Dec. 31, 2013.
Office Action for U.S. Appl. No. 14/245,190, dated Aug. 18, 2014.
Notice of Allowance for U.S. Appl. No. 14/245,190, dated Jan. 14, 2015.
Office Action for U.S. Appl. No. 14/684,678, dated Aug. 28, 2015.
Notice of Allowance for U.S. Appl. No. 14/684,678, dated Feb. 22, 2016.
Office Action for U.S. Appl. No. 15/173,887, dated Dec. 2, 2016.
Office Action for U.S. Appl. No. 15/173,887, dated Aug. 7, 2017.
Office Action for U.S. Appl. No. 15/173,887, dated Jan. 24, 2018.
Office Action for U.S. Appl. No. 15/173,887, dated Jul. 26, 2018.
Office Action for U.S. Appl. No. 16/230,750, dated Sep. 20, 2019.
Office Action for U.S. Appl. No. 16/230,750, dated Jun. 8, 2020.
Office Action for U.S. Appl. No. 11/799,239, dated Oct. 29, 2009.
Office Action for U.S. Appl. No. 11/799,239, dated Jun. 24, 2010.
Notice of Allowance for U.S. Appl. No. 11/799,239, dated Sep. 22, 2011.
Office Action for U.S. Appl. No. 13/301,224, dated May 24, 2012.
Office Action for U.S. Appl. No. 13/301,224, dated Oct. 25, 2012.
Office Action for U.S. Appl. No. 13/301,224, dated Apr. 2, 2013.
Notice of Allowance for U.S. Appl. No. 13/301,224, dated Aug. 30, 2013.
Office Action for U.S. Appl. No. 14/095,891, dated Jun. 10, 2014.
Notice of Allowance for U.S. Appl. No. 14/095,891, dated Jan. 21, 2015.
Office Action for U.S. Appl. No. 14/691,152, dated Apr. 25, 2016.
Notice of Allowance for U.S. Appl. No. 14/691,152, dated Jan. 6, 2017.
Notice of Allowance for U.S. Appl. No. 14/691,152, dated Apr. 19, 2017.
Office Action for U.S. Appl. No. 15/682,431, dated Mar. 12, 2018.
Notice of Allowance for U.S. Appl. No. 15/682,431, dated Jan. 18, 2019.
Office Action for U.S. Appl. No. 16/388,680, dated Jan. 27, 2020.
Office Action for U.S. Appl. No. 16/388,680, dated Jun. 9, 2020.
Office Action for U.S. Appl. No. 12/021,241, dated Apr. 15, 2009.
Office Action for U.S. Appl. No. 12/021,241, dated Dec. 18, 2009.
Office Action for U.S. Appl. No. 12/021,241, dated Sep. 21, 2010.
Office Action for U.S. Appl. No. 12/021,241, dated Feb. 15, 2012.

(56) References Cited

OTHER PUBLICATIONS

Notice of Allowance for U.S. Appl. No. 12/021,241, dated Sep. 25, 2012.
Office Action for U.S. Appl. No. 13/724,157, dated Oct. 10, 2014.
Notice of Allowance for U.S. Appl. No. 13/724,157, dated Mar. 10, 2015.
Office Action for US Application No. 14/788,567, dated Dec. 3, 2015.
Office Action for U.S. Appl. No. 14/788,567, dated Jun. 3, 2016.
Office Action for U.S. Appl. No. 14/788,567, dated Nov. 22, 2016.
Office Action for U.S. Appl. No. 14/788,567, dated May 31, 2017.
Office Action for U.S. Appl. No. 14/788,567, dated Nov. 9, 2017.
Notice of Allowance for U.S. Appl. No. 14/788,567, dated May 31, 2018.
Office Action for U.S. Appl. No. 16/118,329, dated Mar. 28, 2019.
Office Action for U.S. Appl. No. 16/118,329, dated Oct. 10, 2019.
Notice of Allowance for U.S. Appl. No. 16/118,329, dated Feb. 18, 2020.
Office Action for U.S. Appl. No. 12/108,502 dated Jul. 23, 2009.
Office Action for U.S. Appl. No. 12/108,502 dated Apr. 14, 2010.
Office Action for U.S. Appl. No. 12/108,502 dated Dec. 29, 2010.
Office Action for U.S. Appl. No. 12/108,502 dated Sep. 23, 2011.
Notice of Allowance for U.S. Appl. No. 12/108,502 dated Feb. 6, 2014.
Notice of Allowance for U.S. Appl. No. 12/108,502 dated Jul. 18, 2014.
Office Action for U.S. Appl. No. 14/271,881, dated Jul. 28, 2016.
Notice of Allowance for U.S. Appl. No. 14/271,881, dated Apr. 27, 2011.
Office Action for U.S. Appl. No. 15/684,580, dated Apr. 3, 2019.
Office Action for U.S. Appl. No. 12/767,669, dated Aug. 4, 2011.
Office Action for U.S. Appl. No. 12/767,669, dated Jan. 30, 2012.
Office Action for U.S. Appl. No. 12/767,669, dated Oct. 12, 2012.
Office Action for U.S. Appl. No. 12/767,669, dated May 9, 2013.
Office Action for U.S. Appl. No. 12/767,669, dated Oct. 29, 2013.
Office Action for U.S. Appl. No. 12/767,669, dated May 23, 2014.
Notice of Allowance for U.S. Appl. No. 12/767,669, dated Jan. 5, 2015.
Office Action for U.S. Appl. No. 11/962,025, dated Jul. 9, 2010.
Office Action for U.S. Appl. No. 11/962,025, dated Feb. 16, 2011.
Office Action for U.S. Appl. No. 11/962,025, dated May 24, 2012.
Office Action for U.S. Appl. No. 11/962,025, dated Sep. 28, 2012.
Notice of Allowance for U.S. Appl. No. 11/962,025, dated Feb. 8, 2013.
Notice of Allowance received for U.S. Appl. No. 16/901,116, dated Apr. 21, 2021, 50 pages.
Notice of Allowance received for U.S. Appl. No. 16/410,860, dated Jan. 7, 2021, 54 pages.
BICSI, "Network Design Basics for Cabling Professionals", McGraw-Hill, New York, NY, USA, 2002, 393 pages.
Common Public Radio Interface (CPRI) Specification V1 .4, dated Mar. 31, 2006, downloaded from http://www.cpri.inro/spec.html on Mar. 28, 2017, 64 pages.
Common Public Radio Interface (CPRI) Specification V2 1, dated Mar. 31, 2006, downloaded from http://www.cpri.info/spec.html on Mar. 28, 2017, 76 pages.
Common Public Radio Interface (CPRI) Specification V3 0, dated Oct. 20, 2006, downloaded from http://www.cpri.info/spec.html on Mar. 28, 2017, 89 pages.
Common Public Radio Interface (CPRI) Specification V4.0, dated Jun. 30, 2008, downloaded from http://www.cpri.info/spec.html on Mar. 28, 2017, 96 pages.
Common Public Radio Interface (CPRI) Specification V4.1, dated Feb. 18, 2009, downloaded from http://www.cpri.info/spec.html on Mar. 28, 2017, 109 pages.
Grundmann et al., "An empirical comparison of a distributed antenna microcell system versus a single antenna microcell system for indooor spread spectrum communications at 1.8 GHz", ICUPC Conference, 1993, 5 pages.

Zhaohui et al., "A rake type receiver structure for CDMA mobile communication systems using antenna arrays", IEEE, 1996, pp. 528-530.
Kester, Walt, Mastering The Mix In Signal Processing, Mixed-Signal Design Seminar, Analog Devices, Inc., 1991, 3 pages.
Grace, Martin K., "Synchronous quantized subcarrier multiplexing for transport of video, voice, and data", IEEE Journal on Selected Areas in Communications, vol. 8, No. 7, Sep. 1990, pp. 1351-1358.
Wala, Philip M., "A new microcell architecture using digital optical transport", IEEE, 1993, pp. 585-588.
Crofut, Walter, "Remote monitoring of wirelss base stations", Jun. 1, 1998, http://urgentcomm.com/prinUmag/remote-monitoring-wireless-base-stations, downloaded on Mar. 13, 2017, 4 pages.
Cyr et al., "The digital age is here, Digital radio frequency transport enhances cellular network performance", Jul. 4, 1993, Telephony, pp. 20-24.
CityCell 824, "Remote Site Manual, How to use it, Preliminary Version"; Feb. 1, 1993, 237 pages.
Cheun, Kyungwhoon, "Performance of direct-sequence spread-spectrum rake receives with random spreading sequences", IEEE Transactions On Communication, vol. 45, No. 9, Sep. 9, 1997, pp. 1130-1143.
Brunner et al., "On space-time rake receiver structure for WCDMA", 1999, IEEE, pp. 1546-1551.
Graf, Rudolf F., "Modem Dictionary of Electronics, 7th Ed.", Newnes publishing, 1999, 9 pages.
Introduction to Receivers Available at http://weww.ece.ucsb.eduHong/ece145a/lntroduction_to_Receivers.pdf downloaded Jun. 15, 2017, 28 pages.
Pereira, Stephen M., "Standardizing Digital IF Data Transfer with VITA 49", RTC Magazine, downloaded Jun. 15, 2017 from http://rtcmagazine.com/articles/view/100460, 5 pages.
Lan et al., "GSM Co-Channel and Adjacent Channel Interference Analysis and Optimization", Tsinghua Science and Technology, ISSN 1007-0214 04/12, Dec. 2011, vol. 16, No. 5, pp. 583-588.
Laplante, Phillip A. "Comprehensive Dictionary of Electrical Engineering" IEEE Press; CRC Press LLC, 1999; 4 pages.
Microsoft Press "Computer Dictionary: The Comprehensive Standard for Business, School, Library, and Home", 1991, Microsoft Press, ISBN 1-55615-231-0, 6 pages.
Wiley Electrical and Electronics Engineering Dictionary, 2004, Wiley & Sons, Inc., 7 pages.
Parker, Sybil P. "McGraw-Hill Dictionary of Science and Technical Terms: 5th Edition" McGraw-Hill, Inc. 1994; 6 pages.
Horak, Ray, "Telecommunications and Data Communications Handbook", 2007, Wiley & Sons, Inc., 55 pages.
Spurgeon, Charles E., "Ethernet, The Definitive Guide", 2000, O'reilly & Assoc., Inc., 112 pages.
ADC Digivance "Street-Level Coverage Solution (SCS)", Aug. 2005, 8 pages.
ADC Digivance "Street-Level Coverage Solution System with Version 3.01 EMS Software Operation and Maintenance Manual", ADCP-75-187, Issue 1, Sep. 2005, 78 pages.
ADC Digivance "CXD Multi-Band Distributed Antenna System Installation and Operation Manual", ADCP-75-192; Preliminary Issue D; Oct. 2005, 122 pages.
ADC Digivance "Street-Level Coverage Solution 800 MHz, 1900 MHz, and 800/900 MHz SMR System Operation and Maintenance Manual" ADCP-75-187, Preliminary Issue 1B, Nov. 2005, 88 pages.
ADC Digivance "CXD Multi-Band Distributed Antenna System Operation Manual", ADCP-75-192, Issue 1, Dec. 2005, 130 pages.
ADC Digivance "Indoor Coverage Solution 800 MHz Single- or Multi-Mode Fiber System Installation and Operation Manual", ADC-75-130, Preliminary Issue 3C, Aug. 2006, 78 pages.
ADC Digivance "NXD Radio Access Node (RAN) Installation and Maintenance Manual", ADCP-75-210, Issue 1, Nov. 2006, 84 pages.
ADC "ADC FlexWave Prism Element Management System 6.0", User Manual, ADCP-77-152, Issue 1, Mar. 2010, 308 pages.
ADC "ADC FlexWave Prism Element Management System 7.1", User Manual, ADCP-77-177, Issue 1, Jul. 2011, 350 pages.
ADC "ADC FlexWave Prism 6.0", Troubleshooting Guide, ADCP-77-074, Issue 1, Oct. 2010, 62 pages.

(56) References Cited

OTHER PUBLICATIONS

ADC "ADC FlexWave Prism Remote RF Module", Installation Instructions, ADCP-77-079, Issue 2, Mar. 2010, 30 pages.
ADC "ADC FlexWave Prism Remote RF Module", Installation Instructions, ADCP-77-079, Issue 3, Jul. 2011, 32 pages.
ADC "ADC FlexWave Prism Remote 40W RF Module", Installation Instructions, ADCP-77-162, Issue 1, Mar. 2010, 26 pages.
ADC "ADC FlexWave Prism Remote Unit", Installation Guide, ADCP-77-072, Issue 4, Jul. 2011, 44 pages.
ADC "ADC FlexWave Prism Remote Unit", Installation Guide, ADCP-77-072, Issue 5, Nov. 2011, 44 pages.
ADC "FlexWave Prism Flexible Outdoor Wireless Coverage and Capacity", 106969AE, Oct. 2008, 8 pages.
ADC "ADC FlexWave Prism Host, Remote and EMS 5.1", System Reference, ADCP-77-073, Issue 2, Nov. 2009, 364 pages.
ADC "FlexWave URH Operation and Maintenance Manual—Preliminary", 2007, 7 pages.
ADC "ADC FlexWave Universal Radio Head (URH) Remote Unit Installation Instructions", ADCP-75-34 7, Issue 1, Apr. 2008, 32 pages.
ETSI TS 125 101 V.3.11.0 "Universal Mobile Telecommunications System (UMTS); UE Radio Transmission and Reception (FDD) (3GPP TS 25.101 Version 3.11.0 Release 1999", Jun. 2002, 69 pages.
ETSI TS 125 423 V5.6.0 "Universal Mobile Telecommunications System (UMTS); UTRAN lur Interface Radio Network Subsystem Application Part (RNSAP) Signaling (3GPP TS 25.423 version 5.6.0 Release 5)", Jun. 2003, 559 pages.
Hollis et al., "The Theory of Digital Down Conversion", Hunt Engineering, Jun. 26, 2003, 6 pages.
Information Sciences Institute, University of Southern California, "DOD Standard Internet Protocol", RFC 760, Jan. 1980, 46 pages.
Information Sciences Institute, University of Southern California, "Internet Protocol; DARPA Internet Program; Protocol Specification", RFC 791, Sep. 1981, 49 pages.
OBSAI "Open Base Station Architecture Initiative: BTS System Reference Document", Version 2.0; Apr. 27, 2006, 151 pages.
OBSAI "Open Base Station Architecture Initiative: Reference Point 3 Specification" Version 3.1, Nov. 13, 2006, 116 pages.
OBSAI "Open Base Station Architecture Initiative: Reference Point 3 Specification", Version 4.1, Jul. 14, 2008, pp. 1-144.
Notice of Allowance received for U.S. Appl. No. 17/000,188, dated Jan. 19, 2021, 103 pages.
Final Office Action received for U.S. Appl. No. 16/406,252, dated Feb. 5, 2021, 16 pages.
Final Office Action received for U.S. Appl. No. 16/737,419, dated Mar. 11, 2021, 41 pages.
Notice of Allowance received for U.S. Appl. No. 16/777,306, dated Jan. 25, 2021, 49 pages.
Extended European Search Report for application No. 20196761.9 dated Dec. 23, 2020.
Notice of Allowance received for U.S. Appl. No. 16/777,306, dated May 17, 2021, 24 pages.
Notice of Allowance received for U.S. Appl. No. 17/000,188 dated Nov. 25, 2020, 42 pages.
Notice of Allowance received for U.S. Appl. No. 16/944,028, dated Apr. 7, 2021, 31 pages.
Notice of Allowance received for U.S. Appl. No. 16/901,116, dated Jun. 23, 2021, 56 pages.
Notice of Allowance received for U.S. Appl. No. 16/406,252, dated Aug. 5, 2021, 7 pages.
Non Final Office Action received for U.S. Appl. No. 17/234,482, dated Sep. 15, 2021, 55 pages.
Notice of Allowance received for U.S. Appl. No. 16/737,419, dated Nov. 29, 2021, 7 pages.
Notice of Allowance received for U.S. Appl. No. 16/406,252, dated Dec. 2, 2021, 82 pages.
ADC "ADC FlexWave Universal Radio Head (URH) Host Unit Installation Instructions", ADCP-75-348, Issue 1, Apr. 2008, 44 pages.
ADC FlexWave User Manual, "FlexWave Web-Based Element Management System for Universal Radio Head System", Version 2/Version 3, ADCP-75-352, Issue 1, Aug. 2008, 160 pages.
Das et al., "A Dynamic Load balancing Strategy for Channel Assignment Using Selective Borrowing in Cellular Mobile Environment", Wireless Networks, vol. 3, 1997, pp. 333-347.

* cited by examiner

DIGITAL HYBRID MODE POWER AMPLIFIER SYSTEM

CROSS-REFERENCES TO RELATED APPLICATIONS

This application is a continuation of U.S. patent application Ser. No. 15/684,580, filed Aug. 23, 2017, which is a continuation of U.S. patent application Ser. No. 14/271,881, filed on May 7, 2014; now U.S. Pat. No. 9,768,739 on Sep. 19, 2017, which is a continuation of U.S. patent application Ser. No. 12/108,502, filed on Apr. 23, 2008, now U.S. Pat. No. 8,811,917; which claims priority to U.S. Provisional Patent Application No. 60/925,603, filed Apr. 23, 2007. U.S. patent application Ser. No. 12/108,502 is a continuation-in-part of U.S. patent application Ser. No. 12/021,241, filed on Jan. 28, 2008, now U.S. Pat. No. 8,380,143; which is a continuation-in-part of U.S. patent application Ser. No. 11/799,239, filed Apr. 30, 2007, now U.S. Pat. No. 8,064,850; which is a continuation-in-part of U.S. patent application Ser. No. 11/262,079, filed Oct. 27, 2005, now U.S. Pat. No. 8,326,238; which is a continuation of U.S. patent application Ser. No. 10/137,556, filed May 1, 2002, now U.S. Pat. No. 6,985,704. U.S. patent application Ser. No. 12/108,502 further claims priority to U.S. Provisional Patent Application No. 61/041,164, filed Mar. 31, 2008; U.S. Provisional Patent Application No. 61/012,416, filed Dec. 7, 2007; U.S. Provisional Patent Application No. 60/925,577, filed Apr. 23, 2007; U.S. Provisional Patent Application No. 60/969,127, filed Aug. 30, 2007; and U.S. Provisional Patent Application No. 60/969,131, filed Aug. 30, 2007. The disclosures of these applications, and issued patents, are hereby incorporated by reference in their entirety.

FIELD OF THE INVENTION

The present invention generally relates to wireless communication systems using complex modulation techniques. More specifically, the present invention relates to power amplifier systems for wireless communications.

BACKGROUND OF THE INVENTION

A wideband mobile communication system using complex modulation techniques, such as wideband code division access (WCDMA) and orthogonal frequency division multiplexing (OFDM), has large peak-to average power ratio (PAPR) specifications and hence requires highly linear power amplifiers for its RF transmissions. The conventional feedforward linear power amplifier (FFLPA) has been widely utilized due to its excellent linearity performance in spite of poor power efficiency.

Conventional FFLPAs are mainly based on the principle of error subtraction and power-matching with dedicated hardware circuitries to realize non-linear corrections to PA. These approaches must use an auxiliary PA and complicated hardware circuitries to match exactly the transmitted power-balance, time-delay and errors generated by the main PA. After a perfect matching is obtained, the non-linear distortion errors from the main PA can then be canceled by those distortion errors from the auxiliary PA. Due to the complexities of the nonlinear predistortion circuits, which among other things involve many variables and parameters, FFLPAs require significant fine tuning and other calibration efforts. In addition, such traditional FFLPA schemes are also vulnerable to fluctuating environmental conditions, such as temperature and humidity changes, since perfect alignment of the main PA's signal and that of the auxiliary PA are vital. As a result, traditional predistortion schemes are costly to implement and are limited in their predistortion accuracy and stability in a commercial wireless system environment.

In order to overcome the FFLPA's poor efficiency, digital baseband predistortion (PD) has been demonstrated due to the recent advances in digital signal processing (DSP) technology. In addition, Doherty power amplifiers (DPA) have also been applied to these linearization systems to improve power efficiency. However, there is still a demand for higher performance of the power amplifier such as more linearity and better efficiency with less expensive architecture.

Conventional DSP-based PD schemes utilize digital microprocessors to compute, calculate and correct the PA's nonlinearities: they perform fast tracking and adjustments of signals in the PA system. However, conventional DSP-based PD schemes are challenged by variations of the linearity performance of the amplifier due to the environment changing such as temperature and the asymmetric distortions of the output signal of the PA resulting from memory effects. All these variations and distortions have to be compensated for. Since conventional PD algorithms are based on a wideband feedback signal, they require a power-intensive and expensive high speed analog-to-digital converter (ADC) in order to capture necessary information, if at all possible, for processing. In addition, time-synchronizations are also inevitable in order to capture an error signal between a reference signal and a distorted signal. This time-matching process may result in small synchronization errors which can further affect conventional PD schemes' linearization performance.

Moreover, conventional PD schemes necessitate coded in-phase (I) and quadrature (Q) channel signals in the baseband as the required ideal or reference signals. As a result, conventional PD schemes are often standard or modulation specific and must be closely tailored to each baseband system. Therefore, in order to deploy conventional PD schemes into base-stations, the PD engines must be embedded into the baseband architecture of base-stations. This embedment is a practical implementation challenge since it is frequently inconvenient or impossible to modify the baseband architectures of existing base-stations or base-station designs. Once the PD scheme is set up for a specific base-station design, it is often not reconfigurable and hence not upgradeable to future changes in standards or modulations. Furthermore, since traditional PD approaches require baseband I-Q signal sources to operate, they are inapplicable to certain RF systems that do not possess any baseband I-Q signal sources, such as repeater and indoor signal coverage sub-systems.

SUMMARY OF THE INVENTION

Accordingly, the present invention has been made in view of the above problems, and it is an object of the present invention to provide a high performance and cost effective method of power amplifier systems with high linearity and high efficiency for wideband communication system applications. The present disclosure enables a power amplifier system to be field reconfigurable and support multi-modulation schemes (modulation agnostic), multi-carriers and multi-channels.

To achieve the above objects, according to the present invention, the technique is generally based on the method of adaptive digital predistortion to linearize a power amplifier in the RF domain. Various embodiments of the invention are disclosed. In an embodiment, the combination of crest factor reduction, PD, power efficiency boosting techniques as well as a simple algorithm with spectrum monitoring are utilized within a PA system. In another embodiment, analog quadrature modulator compensation structure is also utilized to enhance performance.

Some embodiments of the present invention are able to monitor the fluctuation of the power amplifier characteristics and to self-adjust by means of a self-adaptation algorithm. One such self-adaptation algorithm presently disclosed is called a multi-directional search (MDS) algorithm, which is implemented in the digital domain.

Applications of the present invention are suitable for use with all wireless base-stations, access points, mobile equipment and wireless terminals, portable wireless devices, and other wireless communication systems such as microwave and satellite communications.

Appendix I is a glossary of terms used herein, including acronyms.

BRIEF DESCRIPTION OF THE DRAWINGS

Further objects and advantages of the present invention can be more fully understood from the following detailed description taken in conjunction with the accompanying drawings in which.

DETAILED DESCRIPTION OF SPECIFIC EMBODIMENTS

The present invention is a novel RF-in/RF-out PA system that utilizes an adaptive digital predistortion algorithm. The present invention is a hybrid system of digital and analog modules. The interplay of the digital and analog modules of the hybrid system both linearize the spectral regrowth and enhance the power efficiency of the PA while maintaining or increasing the wide bandwidth. The present invention, therefore, achieves higher efficiency and higher linearity for wideband complex modulation carriers.

Figure 1:
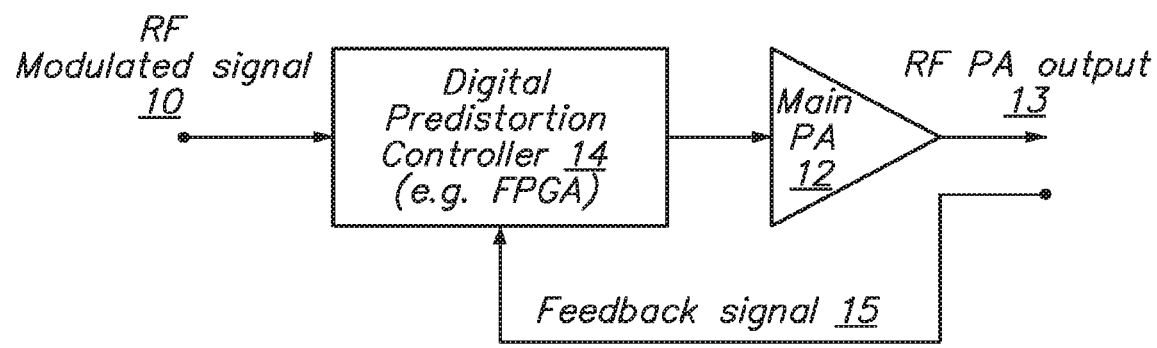
FIG. 1 is a block diagram showing the basic form of a digital hybrid mode power amplifier system.

FIG. 1 is a high level block diagram showing the basic system architecture which can be thought of, at least for some embodiments, as comprising digital and analog modules and a feedback path. The digital module is the digital predistortion controller 14 which comprises the PD algorithm, other auxiliary DSP algorithms, and related digital circuitries. The analog module is the main power amplifier 12, other auxiliary analog circuitries such as DPA, and related peripheral analog circuitries of the overall system. The present invention is a "black box", plug-and-play type system because it accepts RF modulated signal 10 as its input, and provides a substantially identical but amplified RF signal 13 as its output, therefore, it is RF-in/RF-out. The feedback path essentially provides a representation of the output signal to the predistortion controller 14. The present invention is sometimes referred to as a digital hybrid mode power amplifier (DHMPA) system hereinafter.

Figure 2:
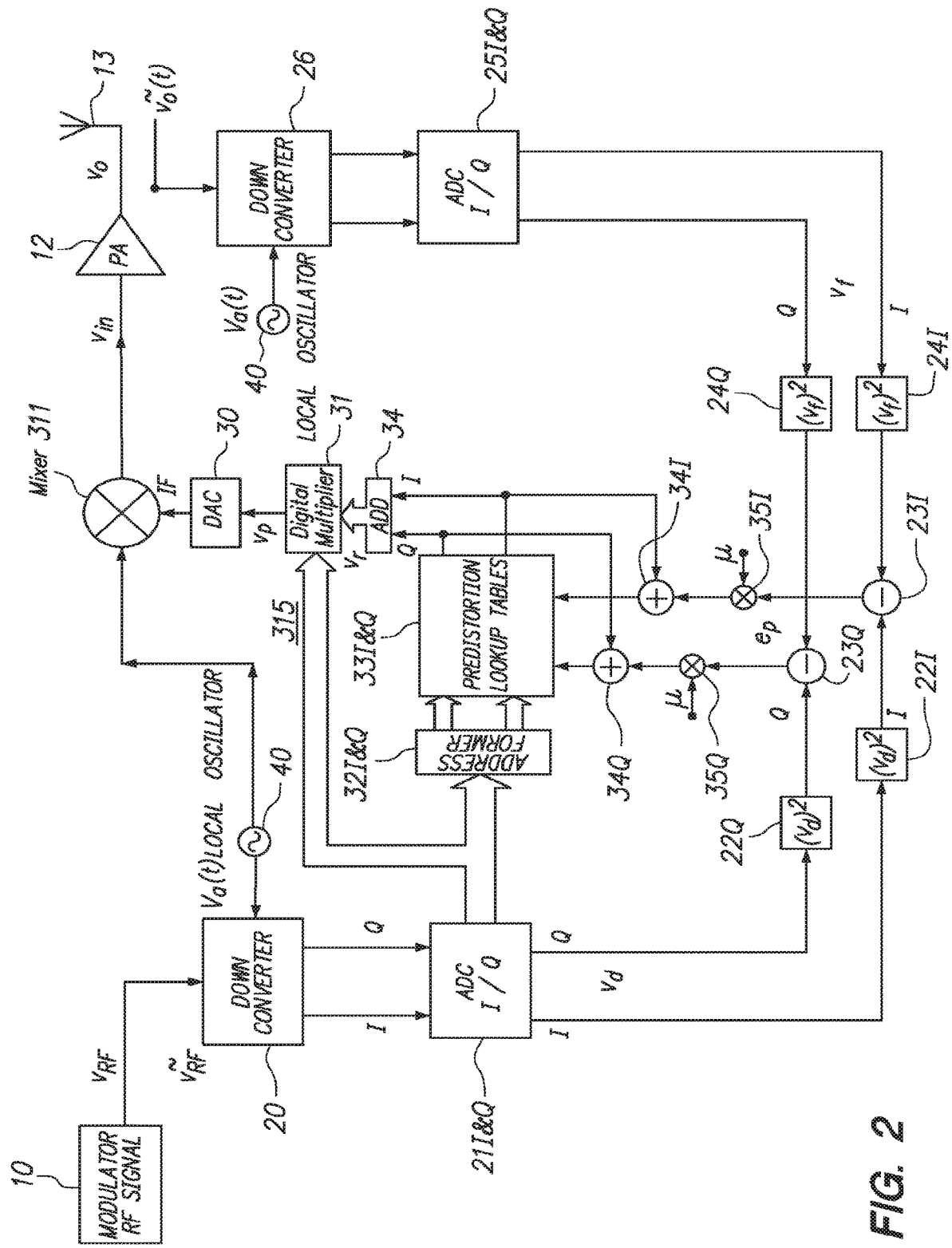
FIG. 2 is a block diagram showing a simple digital hybrid mode power amplifier system according to one embodiment of the present invention.

FIG. 2. is a block diagram showing a simple digital hybrid mode power amplifier system according to one embodiment of the present invention. The embodiment in FIG. 2. is very similar to the architecture disclosed in U.S. patent application Ser. No. 11/799,239, incorporated herein by reference, except that (i) the RF modulated signal 10, VRF, only goes through the down converter 20, (ii) a digital multiplier 31 is used in lieu of analog multipliers, and (iii) the predistorted signal, $V_p$, is up-converted to IF band, then converted into an analog IF signal by DAC 30, and finally modulated into $V_{in}$ RF signal by mixer 311 before being provided as an input to PA 12 for wireless transmission.

FIGS. 5-9 are block diagrams showing more sophisticated embodiments of DHMPA system, where like elements are indicated with like numerals. The five embodiments of FIGS. 5-9 apply crest factor reduction (CFR) prior to the PD with an adaptation algorithm in one digital processor, so as to reduce the PAPR, EVM and ACPR and compensate the memory effects and variation of the linearity due to the temperature changing of the PA. The digital processor can take nearly any form; for convenience, an FPGA implementation is shown as an example, but a general purpose processor is also acceptable in many embodiments. The CFR implemented in the digital module of the embodiments is based on the scaled iterative pulse cancellation presented in U.S. Patent Application No. 61/041,164, filed Mar. 31, 2008, entitled An Efficient Peak Cancellation Method For Reducing The Peak-To-Average Power Ratio In Wideband Communication Systems, incorporated herein by reference. The CFR is included to enhance performance and hence optional. The CFR can be removed from the embodiments without affecting the overall functionality.

Figure 5:
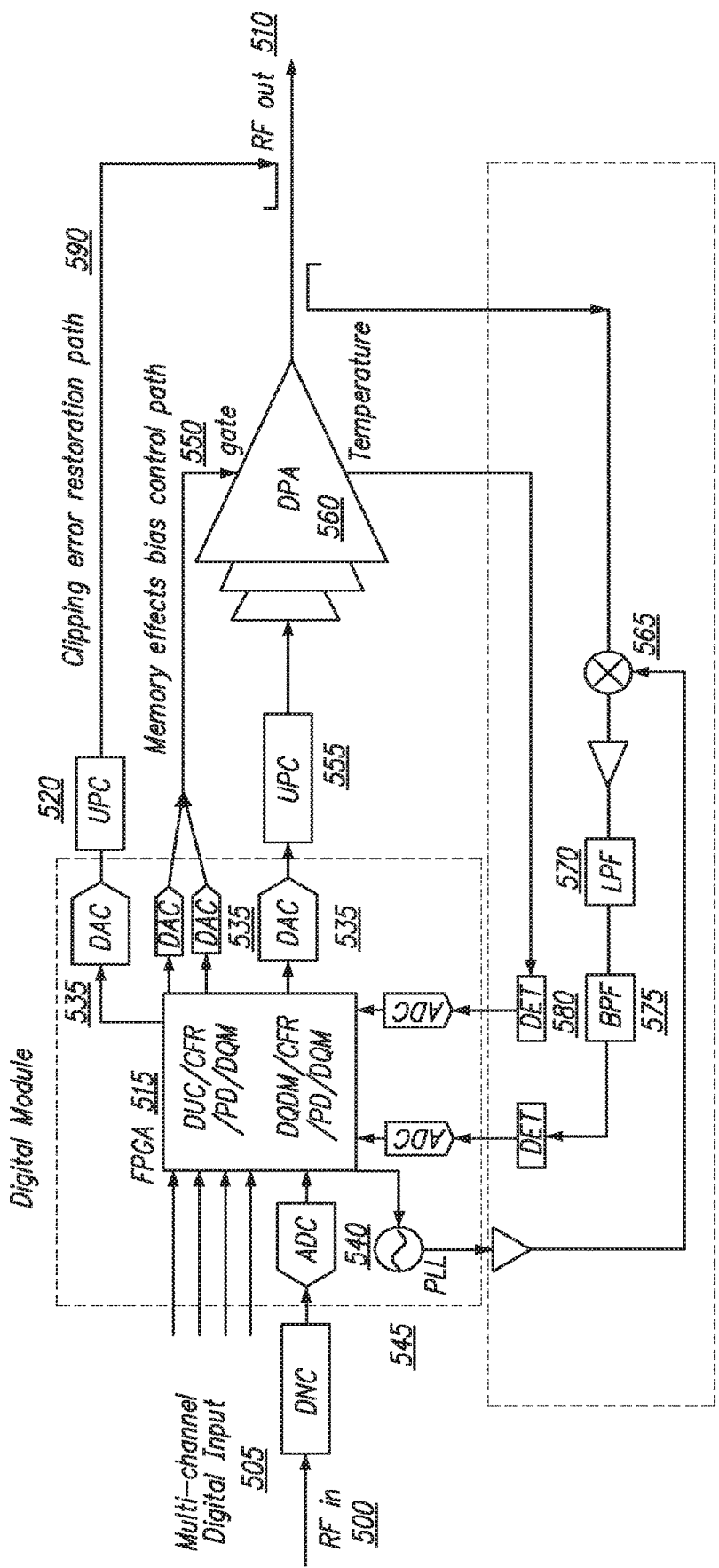
FIG. 5 is a block diagram showing a digital hybrid mode power amplifier system implemented with optional or alternative multichannel digital input, DQM and UPC-based clipping restoration path according to another embodiment of the present invention.

FIG. 5 is a block diagram showing a DHMPA system according to one embodiment of the present invention (the "FIG. 5. System"). The FIG. 5. System has a dual mode of RF 500 and/or multi-carrier digital signal 505 at the input, and an RF signal at the output 510. The dual mode of signal input allows maximum flexibility: RF-in (the "RF-in Mode") or baseband digital-in (the "Baseband-in Mode"). The FIG. 5. System comprises three key portions: a reconfigurable digital (hereinafter referred as "FPGA-based Digital") module 515, a power amplifier module 520 and a feedback path 525.

The FPGA-based Digital part comprises a digital processor 530 (e.g. FPGA), digital-to-analog converters 535

(DACs), analog-to-digital converters 540 (ADCs), and a phase-locked loop (PLL) 545. Since the FIG. 5 System has a dual input mode, the digital processor has two paths of signal processing. For the RF signal input path, the digital processor has implemented a digital quadrature demodulator (DQDM), a CFR, a PD, and a digital quadrature modulator (DQM). For the baseband digital input path, a digital upconverter (DUC), CFR, PD, and a DQM are implemented.

Figure 7:
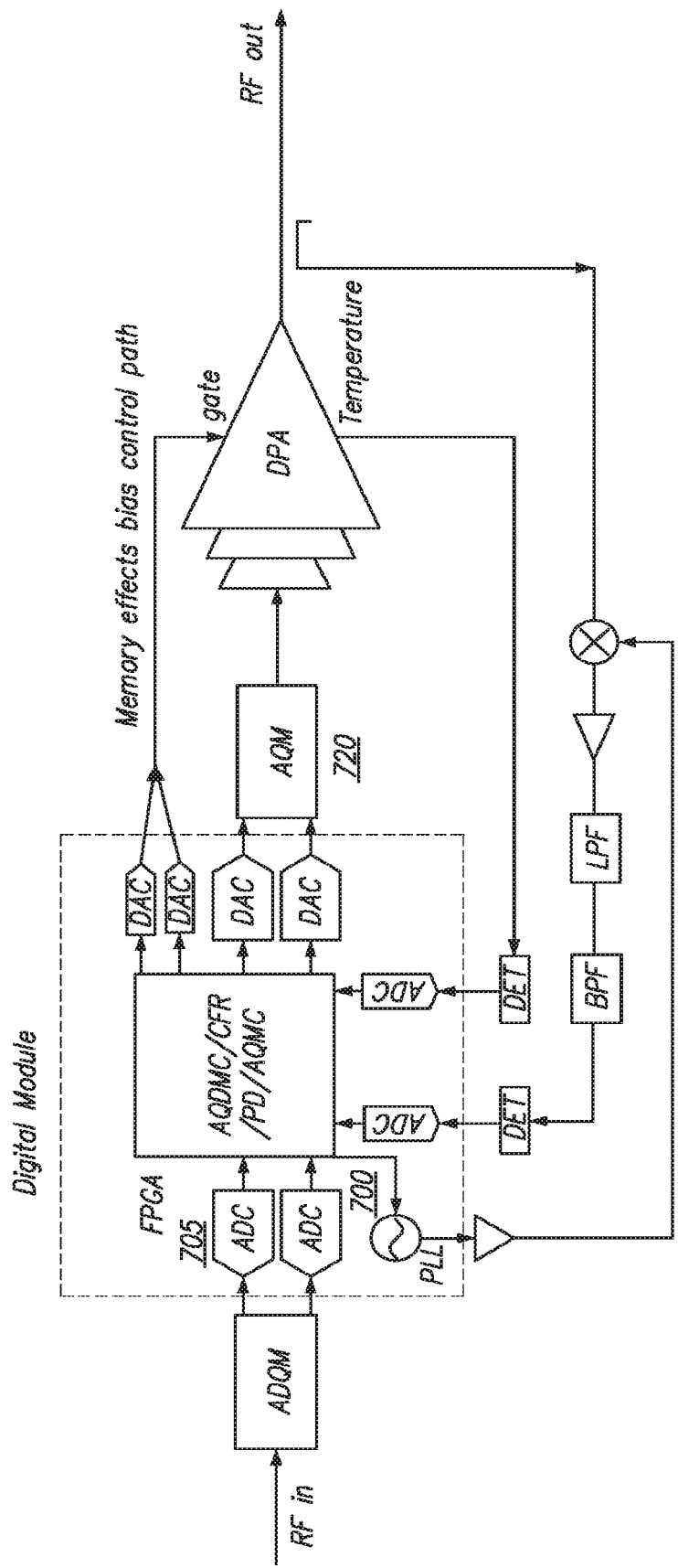
FIG. 7 is a block diagram showing a digital hybrid mode power amplifier system implemented with AQM according to another embodiment of the present invention.
Figure 9:
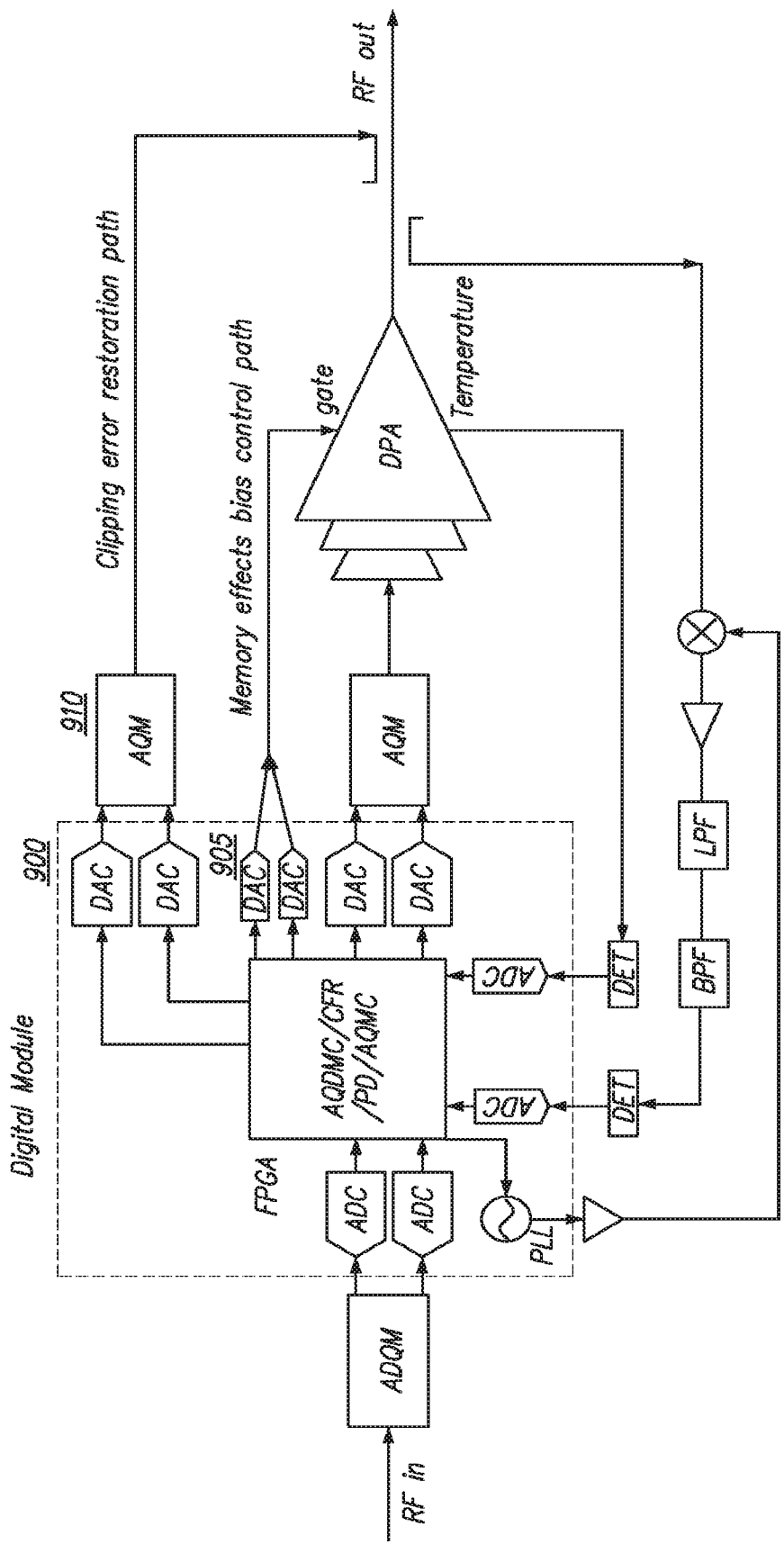
FIG. 9 is a block diagram showing a digital hybrid mode power amplifier system implemented with AQM and AQM-based clipping error restoration path according to another embodiment of the present invention.

The RF-in Mode of the FIG. 5. System has implemented a down converter (DNC) 550 prior to the FPGA-based Digital part and an ADC 540 prior to the FPGA. An analog down converted signal is provided to the FPGA-based Digital module and converted to a digital signal by the ADC 540. The digitally converted signal is demodulated by the DQDM to generate both real and imaginary signals and then PAPR of the signal is reduced by CFR. The peak reduced signal is predistorted to linearize the amplifier and is passed through a DQM to generate the real signal and then converted to an intermediate frequency (IF) analog signal by a DAC in the FPGA-based Digital part. However, it is not required in all embodiments to implement DQDM and DQM in the FPGA. If, as shown in FIGS. 7 and 9, a modulator and demodulator will not be used, then two ADC's 700 and 705 prior to the FPGA and two DAC's 710 and 715 behind the FPGA feeding AQM module 720 can be used to generate real and imaginary signals, respectively (the "AQM Implementation"). The embodiment of FIG. 9 differs from the embodiment of FIG. 7 by virtue of the addition of a clipping error restoration path, indicated by DAC's 900 and 905 together with second AQM logic 910, which feeds to the RF out signal in a manner similar to that shown in FIG. 5.

The Baseband-in Mode of FIG. 5. works slightly different from the RF-in Mode. Digital data streams from multichannels as I-Q signals are coming to the FPGA-based Digital module and are digitally up-converted to digital IF signals by the DUC. From this point onwards, the Baseband-in Mode and RF-in Mode proceeds identically. These IF signals are then passed through the CFR block so as to reduce the signal's PAPR. This PAPR suppressed signal is digitally predistorted in order to pre-compensate for nonlinear distortions of the power amplifier.

In either input mode, the memory effects due to self-heating, bias networks, and frequency dependencies of the active device are compensated by the adaptation algorithm in the PD, as well. The coefficients of the PD are adapted by a narrowband feedback using a simple power detector in the feedback part as opposed to prior art predistortion techniques that use wideband feedback which requires a very high speed ADC. The predistorted signal is passed through a DQM in order to generate the real signal and then converted to an IF analog signal by the DAC 535 as shown. As disclosed above, the DQM is not required to be implemented in the FPGA, or at all, in all embodiments. If the DQM is not used in the FPGA, then the AQM Implementation can be implemented with two DACs to generate real and imaginary signals, respectively. The gate bias voltage 550 of the power amplifier is determined by the adaptation algorithm and then adjusted through the DACs 535 in order to stabilize the linearity fluctuations due to the temperature changes in the power amplifier. The PLL sweeps the local oscillation signal for the feedback part in order to, first, find the channel locations and then detect the adjacent channel power level or the adjacent channel power ratio (ACPR).

The power amplifier part comprises a UPC for a real signal (such as illustrated in the embodiments shown in FIGS. 5, 6, and 8), or an AQM for real and complex signals (such as depicted in the embodiments shown in FIGS. 7 and 9) from the FPGA-based Digital module, a high power amplifier with multi-stage drive amplifiers, and a temperature sensor. The predistorted baseband signals are up-converted by the UPC 555 and then amplified by the PA 560. In order to improve the efficiency performance of the DHMPA system, efficiency boosting techniques such as Doherty, Envelope Elimination and Restoration (EER), Envelope Tracking (ET), Envelope Following (EF), and Linear amplification using Nonlinear Components (LINC) can be used, depending upon the embodiment. These power efficiency techniques can be mixed and matched and are optional features to the fundamental DHMPA system. One such Doherty power amplifier technique is presented in commonly assigned U.S. Provisional Patent Application 60/925,577, filed Apr. 23, 2007, entitled N-Way Doherty Distributed Power Amplifier, incorporated herein by reference. To stabilize the linearity performance of the amplifier, the temperature of the amplifier is monitored by the temperature sensor and then the gate bias of the amplifier is controlled by the FPGA-based Digital part.

The feedback portion comprises a directional coupler, a mixer, a low pass filter (LPF), gain amplifiers and, a band pass filter (BPF), detectors (DETs). Depending upon the embodiment, these analog components can be mixed and matched with other analog components. Part of the RF output signal of the amplifier is sampled by the directional coupler and then down converted to an IF analog signal by the local oscillation signal in the mixer. The IF analog signal is passing through the LPF, the gain amplifier, and the BPF (e.g., surface acoustic wave filter) which can capture different frequency portions of out-of-band distortions. The output of the BPF is provided to the detector and then to the ADCs of the FPGA-based Digital module in order to determine the dynamic parameters of the PD depending on output power levels and asymmetrical distortions due to the memory effects. In addition, temperature is also detected by the DET 580 to calculate the variation of linearity and then adjust gate bias voltage of the PA. More details of the PD algorithm and self-adaptation feedback algorithm can be appreciated from FIG. 3, which shows a polynomial-based predistortion algorithm and from FIG. 4, which shows in flow diagram form as steps 401 through 410 a multi-directional search algorithm which can be used in some embodiments of the invention.

In the case of a strict EVM requirement for broadband wireless access such as WiMAX or other OFDM based schemes (EVM<2.5%), the CFR in the FPGA-based Digital part is only able to achieve a small reduction of the PAPR in order to meet the strict EVM specification. In general circumstances, this means the CFR's power efficiency enhancement capability is limited. In some embodiments of the present invention, a novel technique is included to compensate the in-band distortions from CFR by use of a "Clipping Error Restoration Path" 590, hence maximizing the DHMPA system power efficiency in those strict EVM environments. As noted above, the Clipping Error Restoration Path has an additional DAC 520 in the FPGA-based Digital portion and an extra UPC in the power amplifier part (see FIGS. 5. & 8.). The Clipping Error Restoration Path can allow compensation of in-band distortions resulting from the CFR at the output of the power amplifier. Further, any delay mismatch between the main path and the Clipping Error Restoration Path can be aligned using digital delay in the FPGA.

Figure 6:
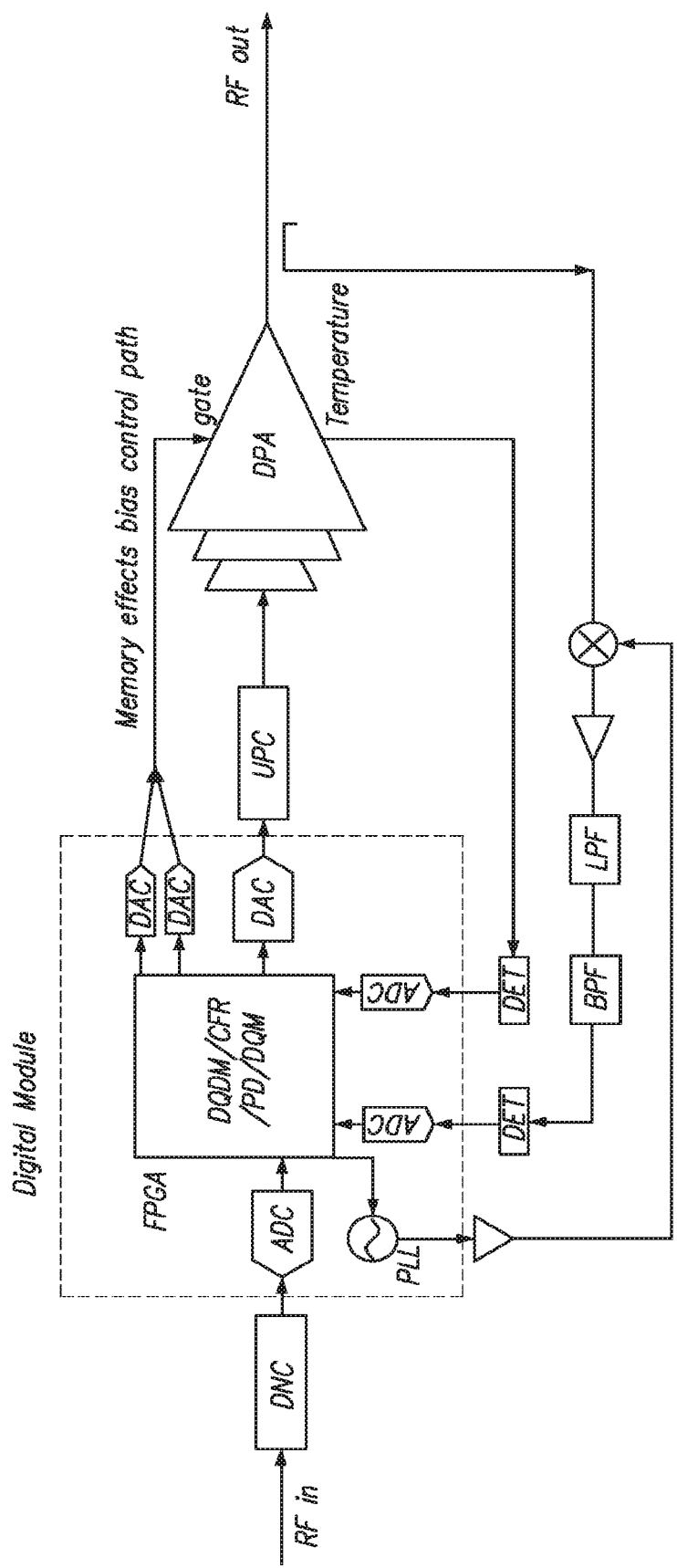
FIG. 6 is a block diagram showing a digital hybrid mode power amplifier system implemented with DQM according to another embodiment of the present invention.

FIG. 6. is a block diagram showing a DHMPA system implemented with DQM according to another embodiment of the present invention (the "FIG. 6 System"). It is identical to FIG. 5 System except that it does not have the Baseband-in Mode and the Clipping Error Restoration Path.

FIG. 7. is a block diagram showing a DHMPA system implemented with AQM according to another embodiment of the present invention (the "FIG. 7 System"). FIG. 7 System is similar to FIG. 6 System except that it has the AQM Implementation option discussed earlier. In addition, the digital processor of FIG. 7 System has implemented an analog quadrature demodulator corrector (AQDMC), a CFR, a PD, and an analog quadrature modulator corrector (AQMC).

In FIG. 7 System, the RF input signal is first down-converted to baseband digital signals, and then digitally up-converted to digital IF signals (−7.5 MHz, −2.5 MHz, 2.5 MHz, 7.5 MHz). If FIG. 7 System has a Baseband-in Mode, then the digital data streams from multi-channels would be digitally up-converted to digital IF signals (−7.5 MHz, −2.5 MHz, 2.5 MHz, 7.5 MHz) directly as they enter the digital processor. The CFR would then reduce the PAPR. The peak reduced signal is predistorted to linearize the DPA and is passing through two DACs for real and imaginary signals and finally through an AQM.

Figure 10:
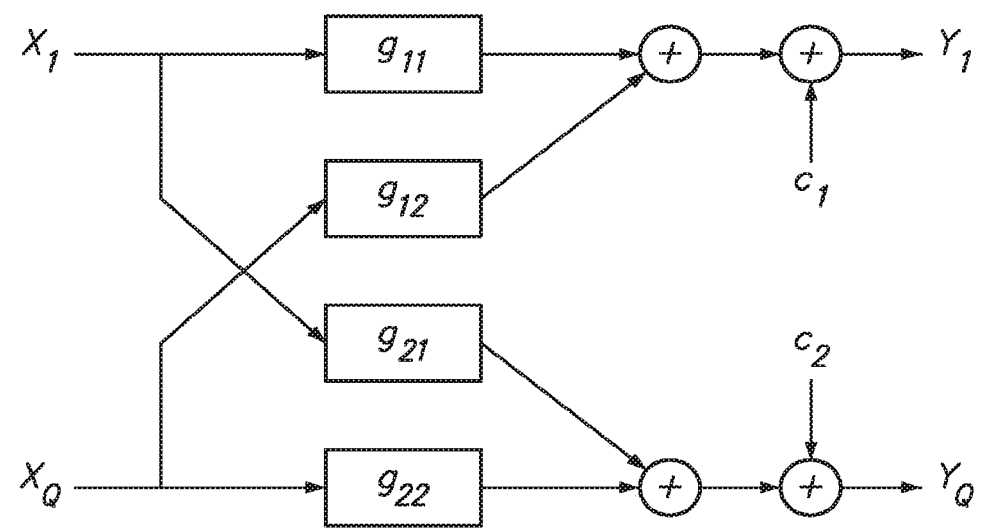
FIG. 10 is a block diagram showing the analog quadrature modulator compensation structure.

FIG. 10. is a block diagram showing the analog quadrature modulator compensation structure. The input signal is separated input an in-phase component $X_I$ and a quadrature component $X_Q$. The analog quadrature modulator compensation structure comprises four real filters {g11, g12, g21, g22} and two DC offset compensation parameters c1, c2. The DC offsets in the AQM will be compensated by the parameters c1, c2. The frequency dependence of the AQM will be compensated by the filters {g11, g12, g21, g22}. The order of the real filters is dependent on the level of compensation required. The output signals $Y_I$ and $Y_Q$ will be presented to the AQM's in-phase and quadrature ports.

The configuration of the power amplifier part and the feedback part of FIG. 7 System are the same as FIG. 6 System.

Figure 8:
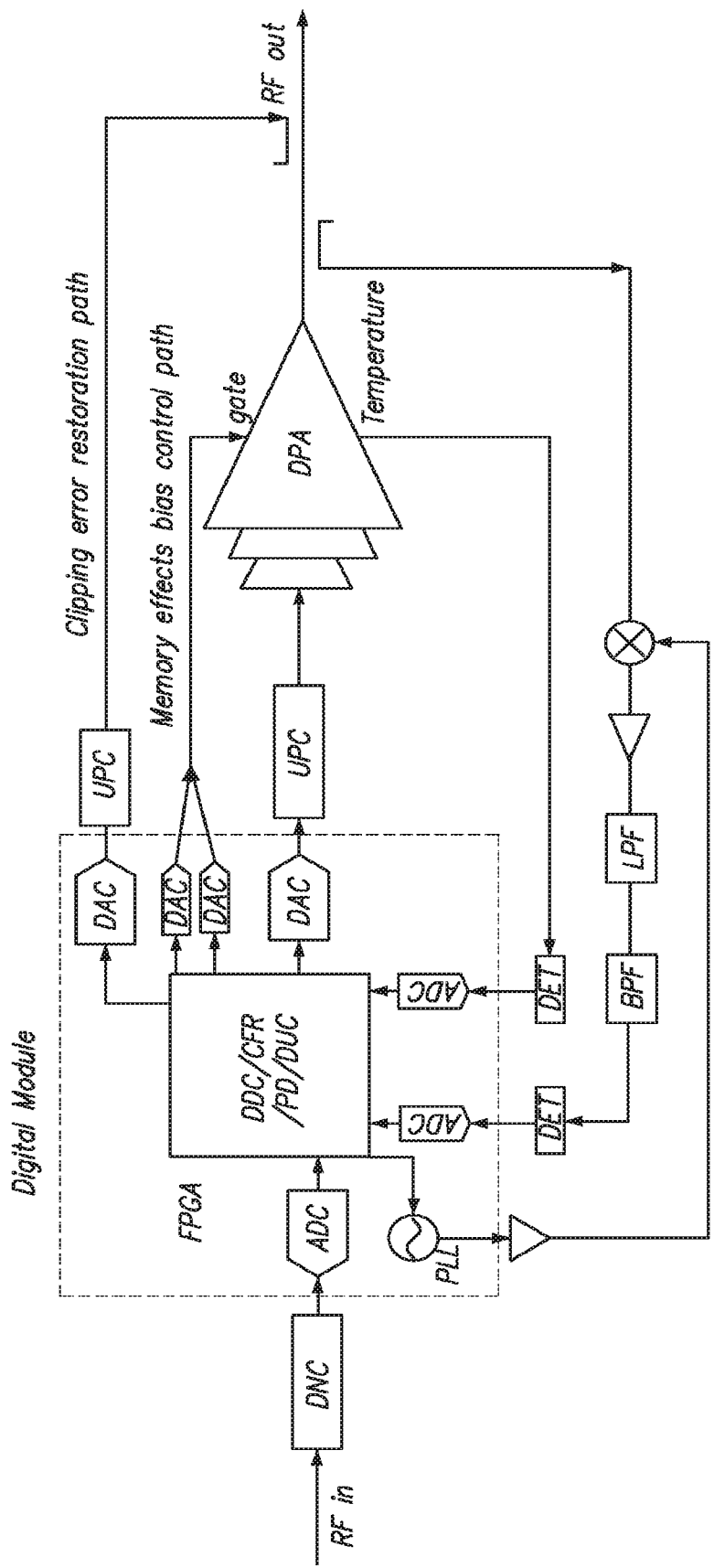
FIG. 8 is a block diagram showing a digital hybrid mode power amplifier system implemented with DUC and UPC-based clipping error restoration path according to another embodiment of the present invention.

FIG. 8. is a block diagram showing a DHMPA system implemented with DUC and the Clipping Error Restoration Path according to another embodiment of the present invention (the "FIG. 8 System"). FIG. 8 System is similar to FIG. 6 System except that it has the Clipping Error Restoration Path. In addition, the digital processor of FIG. 8 System has implemented a digital down converter (DDC), a CFR, a PD, and DUC.

In FIG. 8 System, the DNC frequency translates the RF signal into a low IF signal. The IF signal is then presented to the ADC whereupon it is digitally down-converted to baseband followed by CFR and PD. The output of the PD is a baseband signal which will then be digitally upconverted to an IF frequency and presented to the DAC. The output of the DAC is then further frequency translated to a RF frequency through the UPC. The configuration of the power amplifier part and the feedback part of FIG. 8 System are the same as FIG. 5 System.

FIG. 9. is a block diagram showing a DHMPA system implemented with AQM and AQM-based Clipping Error Restoration Path according to another embodiment of the present invention (the "FIG. 9 System"). FIG. 9 System is identical to FIG. 7 System except that FIG. 9 System has the Clipping Error Restoration Path. The Clipping Error Restoration Path in FIG. 9 System has two DACs in the FPGA-based Digital part and an AQM in lieu of the UPC in the power amplifier part (see FIGS. 5. & 8.).

Figure 3:
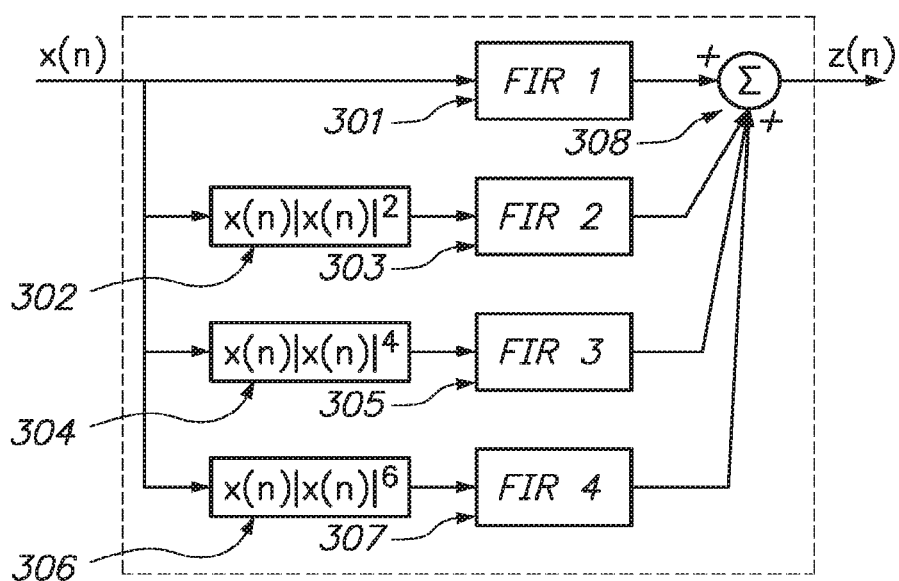
FIG. 3 is a block diagram showing polynomial based predistortion in a digital hybrid mode power amplifier system of the present invention.

FIG. 3. is a block diagram showing a predistortion (PD) part in the DHMPA system of the present invention. The PD in the present invention generally utilizes an adaptive LUT-based digital predistortion system. More specifically, the PD illustrated in FIG. 3 and in embodiments disclosed from FIG. 5 to FIG. 9 are processed in the digital processor by an adaptive algorithm, presented in U.S. patent application Ser. No. 11/961,969, entitled A Method for Baseband Predistortion Linearization in Multi-Channel Wideband Communication Systems. The PD for the DHMPA system in FIG. 3. has multiple finite impulse response (FIR) filters, that is, FIR1 301, FIR2 303, FIR3 305, and FIR4 307. The PD also contains the third order product generation block 302, the fifth order product generation block 304, and the seventh order product generation block 306. The output signals from FIR filters are combined in the summation block 308. Coefficients for multiple FIR filters are updated by the MDS algorithm based on the adjacent channel power level or the ACPR as an evaluation function.

Figure 4:
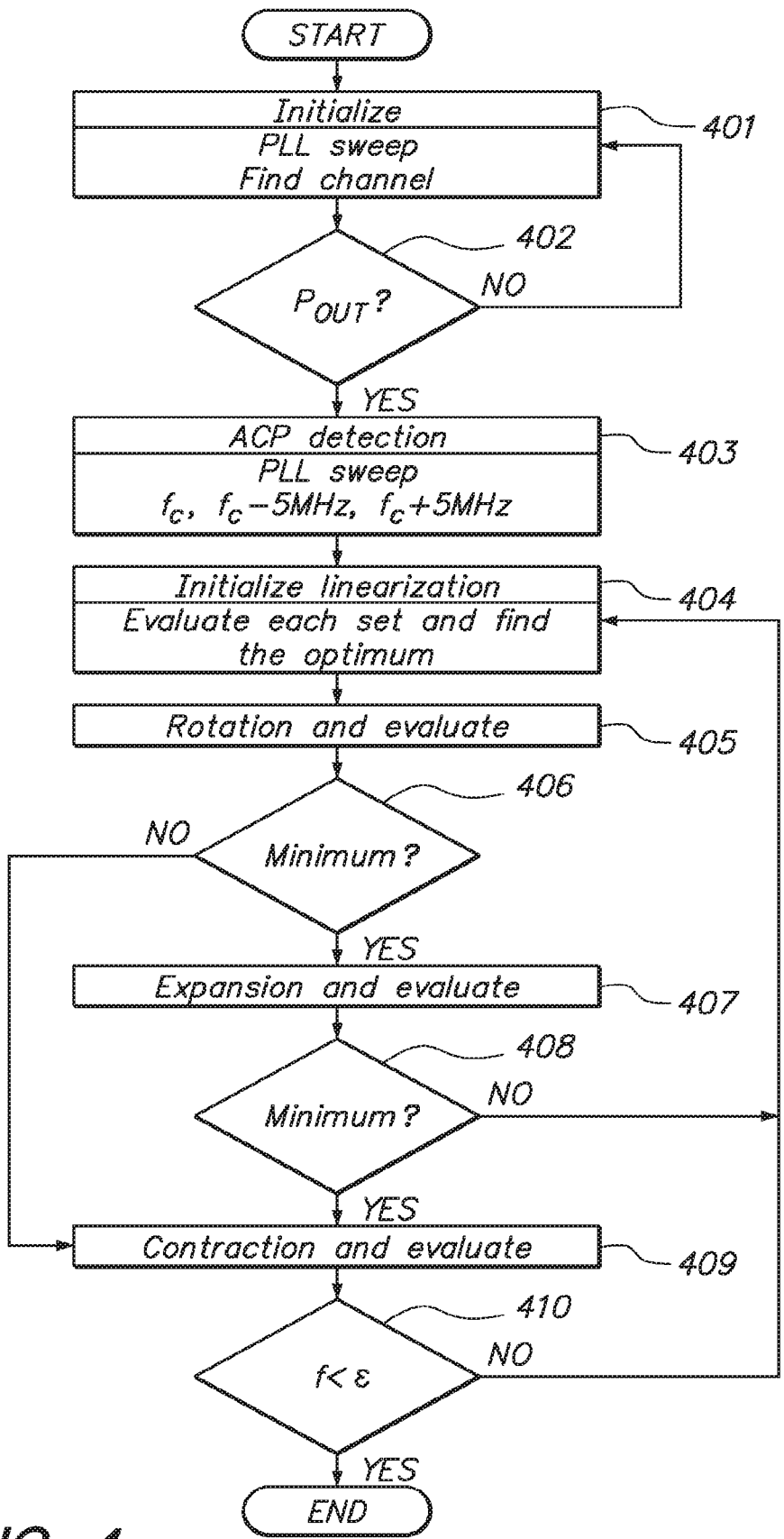
FIG. 4 is a flow chart of the multi-directional search algorithm applied for self-adaptation predistortion in a digital hybrid mode power amplifier system of the present invention.

FIG. 4. is a flow chart of a method for compensating for the PD in the DHMPA system of the present invention. It is the self-adaptation feedback part of the DHMPA system that utilizes the MDS algorithm. Operation of the predistortion compensating apparatus of FIG. 3 may be described with reference to this flow chart.

For purposes of simplicity, but not by way of limitation, WCDMA has been used as an example to illustrate the self-adaptation feedback part and the MDS algorithm. The present invention is by no means limited to WCDMA, since the present invention is standard and modulation agnostic. In WCDMA applications, 12 WCDMA channels are detected first by sweeping PLL in the feedback part (401) in order to search the activated and deactivated channels. Once channel locations are searched (402), the feedback part detects adjacent channel power level or ACPR (especially 5 MHz offset components) again by sweeping PLL (403). Then initialize predistortion and apply the MDS algorithm as follows:

At any iteration k, evaluate each coefficients set, then find the optimum set, $a_o^k$ (404)

Rotation 405: rotate $a_o^k$ and evaluate. If $\min\{f(a_n^k), i=1, \ldots, n\} < f(a_o^k)$ is achieved (406), then go to the Expansion 407; or else go to Contraction 409.

Expansion 407: expand $a_n^k$ and evaluate. If $\min\{f(a_{ei}^k), i=1, \ldots, n\} < \min\{f(a_n^k), i=1, \ldots, n\}$ is achieved (408), then set $a_o^k = ei^k$; or else set $a_o^k = a_n^k$ and go to (1)

Contraction 409: contract $a_o^k$, evaluate, and set $a_o^k = a_{ci}^k$, then go to (1)

where, a is a vector of coefficients for multiple FIR filters, and f is the evaluation function, which is the adjacent channel power level or the ACPR.

The algorithm stops if the evaluation function is less than the minimum target value (410). This MDS algorithm is elegantly simple to be implemented.

In summary, the DHMPA system of the present invention could enhance the performance for the efficiency and linearity more effectively since the DHMPA system is able to implement CFR, DPD and adaptation algorithm in one digital processor, which subsequently saves hardware resources and processing time. The DHMPA system is also reconfigurable and field-programmable since the algorithms and power efficiency enhancing features can be adjusted like software in the digital processor at anytime.

Furthermore, since the DHMPA system accepts RF modulated signal as input, it is not necessary to use the coded I and Q channel signals in the baseband. Therefore, the performance of wireless base-station systems can be enhanced simply by replacing the existing PA modules with the DHMPA. The present invention allows a "plug and play" PA system solution such that existing base-station systems do not need to modify their structures and/or rebuild a new set of signal channels in order to benefit from high efficiency and high linearity PA system performance.

Moreover, the DHMPA system is agnostic to modulation schemes such as QPSK, QAM, OFDM, etc. in CDMA, GSM, WCDMA, CDMA2000, and wireless LAN systems. This means that the DHMPA system is capable of supporting multi-modulation schemes, multi-carriers and multi-channels. Other benefits of the DHMPA system includes correction of PA non-linearities in repeater or indoor coverage systems that do not have the necessary baseband signals information readily available.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

APPENDIX I

Glossary of Terms

ACLR Adjacent Channel Leakage Ratio
ACPR Adjacent Channel Power Ratio
ADC Analog to Digital Converter
AQDM Analog Quadrature Demodulator
AQM Analog Quadrature Modulator
AQDMC Analog Quadrature Demodulator Corrector
AQMC Analog Quadrature Modulator Corrector
BPF Bandpass Filter
CDMA Code Division Multiple Access
CFR Crest Factor Reduction
DAC Digital to Analog Converter
DET Detector
DHMPA Digital Hybrid Mode Power Amplifier
DDC Digital Down Converter
DNC Down Converter
DPA Doherty Power Amplifier
DQDM Digital Quadrature Demodulator
DQM Digital Quadrature Modulator
DSP Digital Signal Processing
DUC Digital Up Converter
EER Envelope Elimination and Restoration
EF Envelope Following
ET Envelope Tracking
EVM Error Vector Magnitude
FFLPA Feedforward Linear Power Amplifier
FIR Finite Impulse Response
FPGA Field-Programmable Gate Array
GSM Global System for Mobile communications
I-Q In-phase/Quadrature
IF Intermediate Frequency
LINC Linear Amplification using Nonlinear Components
LO Local Oscillator
LPF Low Pass Filter
MCPA Multi-Carrier Power Amplifier
MDS Multi-Directional Search
OFDM Orthogonal Frequency Division Multiplexing
PA Power Amplifier
PAPR Peak-to-Average Power Ratio
PD Digital Baseband Predistortion
PLL Phase Locked Loop
QAM Quadrature Amplitude Modulation
QPSK Quadrature Phase Shift Keying
RF Radio Frequency
SAW Surface Acoustic Wave Filter
UMTS Universal Mobile Telecommunications System
UPC Up Converter
WCDMA Wideband Code Division Multiple Access
WLAN Wireless Local Area Network

What is claimed is:

1. A digital hybrid mode power amplifier system comprising:
   a down-converted RF input;
   a multi-channel digital input;
   a digital predistortion module for receiving at least one of the down-converted RF inputs or multi-channel digital inputs, wherein the digital predistortion module utilizes a predistortion polynomial;
   a power amplifier portion responsive to signals representative of an output of the digital module; and
   a down-converted feedback portion adapted to monitor signals representative of power amplifier distortion for feeding back to the digital predistortion module signals representative of an output of one or more channels of the power amplifier portion, in response to which the digital predistortion module computes the predistortion polynomial and modifies its output to reduce the power amplifier distortion,
   wherein the digital predistortion module adaptively compensates for nonlinearity and memory effects resulting from asymmetric distortion introduced by the power amplifier portion.

2. The digital hybrid mode power amplifier system of claim 1, wherein the digital predistortion module comprises at least one of a digital field programmable gate array, digital-to-analog converters, analog-to-digital converters, or a phase-locked loop.

3. The digital hybrid mode power amplifier system of claim 2, wherein:
   the power amplifier system is configured for base station applications, and the digital field programmable gate array comprises at least one of a digital up-converter, a crest factor reduction, a predistorter, or a digital quadrature modulator.

4. The digital hybrid mode power amplifier system of claim 2, wherein:
   the power amplifier system is configured for repeater applications, and
   the digital field programmable gate array comprises at least one of a digital quadrature demodulator, a crest factor reduction, a predistorter, or a digital quadrature modulator.

5. The digital hybrid mode power amplifier system of claim 2, wherein the digital field programmable gate array comprises an adaptation algorithm to determine an optimum gate bias voltage of the power amplifier for stabilizing linearity fluctuations due to temperature changes of the power amplifier.

6. The digital hybrid mode power amplifier system of claim 1, wherein the power amplifier portion comprises at least one of an up-converter for real signal and an analog quadrature modulator for real and complex signals, a high power amplifier with multi-stage drive amplifiers, or a temperature sensor.

7. The digital hybrid mode power amplifier system of claim 6, wherein the power amplifier portion uses efficiency boosting techniques comprising at least one of Doherty, Envelope Elimination and Restoration, Envelope Tracking, Envelope Following, or Linear amplification using Nonlinear Components.

8. The digital hybrid mode power amplifier system of claim 1, wherein the feedback portion comprises at least one of a directional coupler, a mixer, a low pass filter, gain amplifiers, a band pass filter, or detectors.

9. The digital hybrid mode power amplifier system of claim 1, wherein in-band distortion resulting from a clipped signal at the output of the power amplifier portion caused by crest factor reduction is compensated by a DAC and UPC responsive to an output of the digital predistortion module.

10. The digital hybrid mode power amplifier system of claim 1, wherein the adaptive compensation for predistortion further comprises:
updating coefficients by detecting adjacent channel powers; and
using the adjacent channel powers in performing an evaluative function.

11. The digital hybrid mode power amplifier system of claim 1, wherein the digital predistortion module further compensates for symmetric distortion.

12. A digital hybrid mode power amplifier system comprising:
a digital predistortion module for receiving multi-channel digital input, wherein the digital predistortion module utilizes a predistortion polynomial;
a power amplifier portion responsive to signals representative of an output of the digital module; and
a down-converted feedback portion adapted to monitor signals representative of power amplifier distortion for feeding back to the digital predistortion module signals representative of the output of one or more channels of the power amplifier portion, in response to which the digital predistortion module computes the predistortion polynomial and modifies its output to reduce the power amplifier distortion,
wherein the digital predistortion module adaptively compensates for nonlinearity and memory effects resulting from asymmetric distortion introduced by the power amplifier portion.

13. The digital hybrid mode power amplifier system of claim 12, wherein the digital predistortion module searches locations of a main channel signal to determine a value representative of adjacent channel power, and implements a multi-directional search algorithm comprising evaluation, rotation, expansion, and contraction using the adjacent channel power value or an adjacent channel power ratio as an evaluation function to develop coefficients for modifying its output.

14. The digital hybrid mode power amplifier system of claim 12, wherein the digital predistortion module comprises at least one of a digital field programmable gate array, digital-to-analog converters, analog-to-digital converters, or a phase-locked loop.

15. The digital hybrid mode power amplifier system of claim 14, wherein: the power amplifier system is configured for base station applications, and the digital field programmable gate array comprises at least one of a digital up-converter, a crest factor reduction, a predistorter, or a digital quadrature modulator.

16. The digital hybrid mode power amplifier system of claim 14, wherein the digital field programmable gate array comprises an adaptation algorithm to determine an optimum gate bias voltage of the power amplifier for stabilizing linearity fluctuations due to temperature changes of the power amplifier.

17. The digital hybrid mode power amplifier system of claim 12, wherein the adaptive compensation for predistortion further comprises:
updating coefficients by detecting adjacent channel powers; and
using the adjacent channel powers in performing an evaluative function.

18. The digital hybrid mode power amplifier system of claim 12, wherein the power amplifier portion comprises at least one of an up-converter for real signal and an analog quadrature modulator for real and complex signals, a high power amplifier with multi-stage drive amplifiers, or a temperature sensor.

19. The digital hybrid mode power amplifier system of claim 18, wherein the power amplifier portion uses efficiency boosting techniques comprising at least one of Doherty, Envelope Elimination and Restoration, Envelope Tracking, Envelope Following, or Linear amplification using Nonlinear Components.

20. The digital hybrid mode power amplifier system of claim 12, wherein the feedback portion comprises at least one of a directional coupler, a mixer, a low pass filter, gain amplifiers, a band pass filter, or detectors.

21. The digital hybrid mode power amplifier system of claim 12, wherein in-band distortion resulting from a clipped signal at the output of the power amplifier portion caused by crest factor reduction is compensated by a DAC and UPC responsive to an output of the digital predistortion module.

22. The digital hybrid mode power amplifier system of claim 12, wherein the digital predistortion module further compensates for symmetric distortion.

* * * * *